United States Patent [19]

Tatsumi et al.

[11] Patent Number: 4,882,507

[45] Date of Patent: Nov. 21, 1989

[54] OUTPUT CIRCUIT OF SEMICONDUCTOR INTEGRATED CIRCUIT DEVICE

[75] Inventors: Yuuichi Tatsumi, Tokyo; Hidenobu Minagawa, Kawasaki; Hiroshi Iwahashi, Yokohama; Masamichi Asano, Tokyo; Mizuho Imai, Annaka, all of Japan

[73] Assignee: Kabushiki Kaisha Toshiba, Kawasaki, Japan

[21] Appl. No.: 226,307

[22] Filed: Jul. 29, 1988

[30] Foreign Application Priority Data

Jul. 31, 1987 [JP] Japan .................. 62-191602

[51] Int. Cl.[4] ............... H03K 3/013; H03K 17/06; H03K 17/16; H03K 17/284
[52] U.S. Cl. .................. 307/443; 307/448; 307/473; 307/270; 307/296.5; 365/194; 365/226
[58] Field of Search .......... 307/442, 443, 473, 270, 307/296.5, 448; 365/226, 228, 194, 195, 196

[56] References Cited

U.S. PATENT DOCUMENTS

| | | | |
|---|---|---|---|
| 4,638,187 | 1/1987 | Boler et al. | 307/473 X |
| 4,785,203 | 11/1988 | Nakamura | 307/443 X |
| 4,798,979 | 1/1989 | Lee et al. | 307/443 X |

FOREIGN PATENT DOCUMENTS 61-95792  5/1987  Japan .
62-150585 7/1987  Japan .

Primary Examiner—Stanley D. Miller
Assistant Examiner—David R. Bertelson
Attorney, Agent, or Firm—Finnegan, Henderson, Farabow, Garrett and Dunner

[57] ABSTRACT

A semiconductor integrated circuit includes an output circuit and a control circuit for controlling the output circuit. The control circuit controls the output circuit so as to charge or discharge a preset node in the output circuit at a rate different from an ordinary charging or discharging rate for a preset period of time after a control signal has been changed in level.

24 Claims, 11 Drawing Sheets

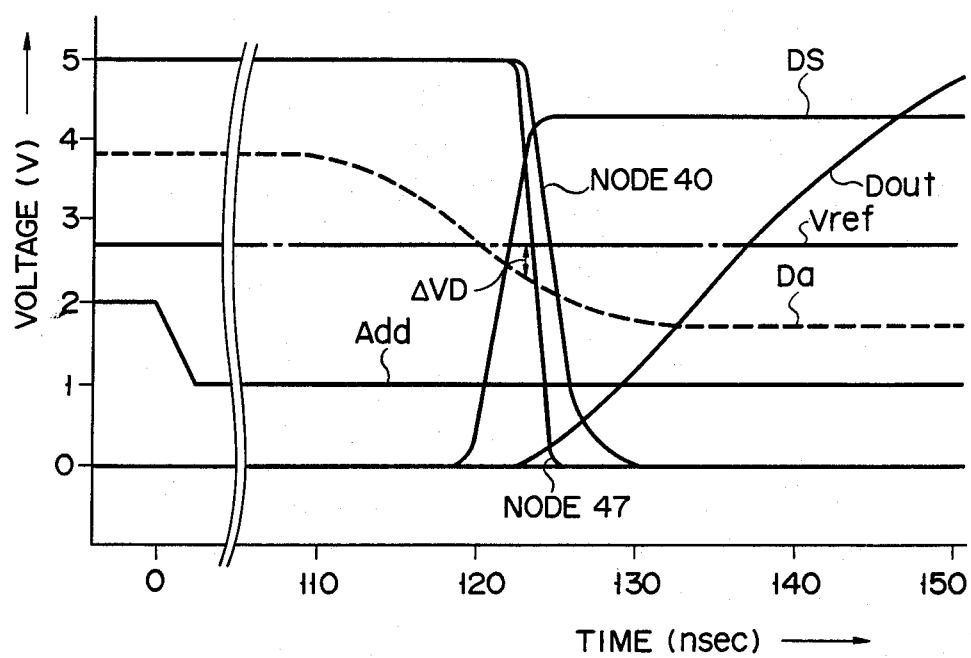
F I G. 7

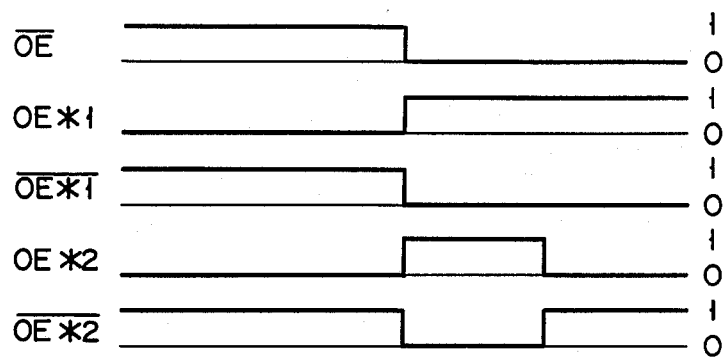
F I G. 10

OUTPUT CIRCUIT OF SEMICONDUCTOR INTEGRATED CIRCUIT DEVICE

BACKGROUND OF THE INVENTION

1. Field of the Invention

This invention relates to a semiconductor integrated circuit with an output circuit for externally outputting a signal or data, and more particularly to a semiconductor integrated circuit in which a signal or data output speed can be controlled in accordance with a control signal.

2. Description of the Related Art

In an ordinary semiconductor integrated circuit such as a semiconductor memory device, a signal or data is externally supplied via an output circuit which is generally called an output buffer circuit. In general, a semiconductor memory device is designed to meet the application thereof and at the same time to attain a preset readout speed in a condition that a load capacitance of approx. 100 pF is connected to the data output terminal For example, address access time $t_{ACC}$ from a time that the address signal starts to vary to a time that data is read out is set to 150 ns at maximum. Further, time $t_{OE}$ from a time that output enable signal $\overline{OE}$ is activated to a time that output data is determined is set to approx. 70 ns at maximum.

Since it is necessary to charge or discharge the load capacitor connected to the output terminal. A large current will flow at this time, and therefore the power source voltage fluctuates, causing noise to be generated. Such a noise may cause the integrated circuit to operate erroneously. Generally, the output circuit includes a buffer amplifier section for directly driving the load, and a pre-amplifier section for driving the buffer amplifier section. In order to suppress generation of noise due to rapid variation in current flowing in the output circuit, transistors constituting the pre-amplifier section or transistors constituting the buffer amplifier section are each formed to have a small channel width in the prior art. In this way, if the channel width of the transistor of the pre-amplifier section is set to be small, the current driving ability of the transistor becomes small, thereby causing the potential of a signal supplied to the gate of the transistor of the buffer amplifier section to rise or fall slowly. Therefore, current flowing in the buffer amplifier section will not vary abruptly, suppressing the noise generation due to the fluctuation in the power source voltage. Also, when the transistor of the buffer amplifier section has a small channel width, a small amount of current flows in the buffer amplifier section. This suppresses the generation of noise due to the fluctuation in the power source voltage, thereby preventing an erroneous circuit operation of the IC. However, with these methods, the operation speed or the data readout speed will be lowered.

With the conventional method, increase in the operation speed and reduction in the noise cannot be attained at the same time. Thus, when a high-speed operation is desired, and suppression of noise is also required, a thick power-source line is used, or a large-capacitance decoupling capacitor is connected between the power source of the semiconductor integrated circuit and the ground. Use of the thick line or the large-capacitance capacitor inevitably raise the cost of the apparatus in which the integrated circuit is incorporated. Further, when the sufficient suppression of the noise in desired and the reduction of the cost of the apparatus in also required, the operation speed is lowered.

As described above, in the conventional semiconductor integrated circuit, increase in the operation speed of the output circuit and reduction in the noise cannot be attained at the same time.

SUMMARY OF THE INVENTION

It is accordingly the object of the present invention to provide a semiconductor integrated circuit which makes no operation errors despite noise, without reducing the operation speed of its output section.

According to one embodiment of this invention, there is provided a semiconductor integrated circuit comprising an output circuit including a transistor whose conduction state is controlled in response to an internal signal and charging or discharging a preset node at a predetermined rate by controlling the conduction state of the transistor, thus outputting a signal; and a control circuit for charging or discharging the preset node of the output circuit at a rate different from the predetermined rate by increasing the rate of reduction in the conduction resistance of the transistor for a preset period of time after the control signal has changed in level.

According to another embodiment of this invention, there is provided a semiconductor integrated circuit comprising a data output circuit including a transistor whose conduction state is controlled according to readout data and charging or discharging a preset node at a predetermined rate by controlling the conduction state of the transistor, thus outputting memory cell data; and a control circuit for charging or discharging the preset node of the data output circuit at a rate different from the predetermined rate for a preset period of time after an output enable signal has changed in level.

With the construction described above, the control circuit is operated to charge or discharge the preset node of the data output circuit for a preset period of time after the control signal has changed in level. Therefore, the preset node can be rapidly charged or discharged, permitting data to be read out at a high speed.

BRIEF DESCRIPTION OF THE DRAWINGS

FIG. 7 is a diagram showing the waveforms of the signals which are generated at the various portions of the circuit shown in FIGS. 1 and 2 when no output control circuit is used;

FIG. 10 is a timing chart for illustrating the operation of the output circuit shown in FIG. 9.

DETAILED DESCRIPTION OF THE PREFERRED EMBODIMENTS

First, the technical idea underlying this invention is explained before explaining the embodiments of this invention.

For example, in the standard of a semiconductor memory device (TC571000D and TC571001D manufactured by TOSHIBA Co., Ltd Japan. are shown as examples), it is generally required as shown in the table-1 to set readout times $t_{OE}$ and $t_{PGM}$ shorter than address access time $t_{ACC}$ and chip-enable access time $t_{CE}$. Address access time $t_{ACC}$ ranges from variation of the address signal to the data readout time, chip-enable access time $t_{CE}$ ranges from variation of chip enable signal $\overline{CE}$ to the data readout time, and times $t_{OE}$ and $t_{PGM}$ range respectively from variation of output buffer enable signal $\overline{OE}$ and program mode setting signal $\overline{PGM}$ to the data readout time. As shown in the table-1, time $t_{ACC}$ is set at 150 ns or 200 ns at maximum, but times $t_{OE}$ and $t_{PGM}$ are set at 70 ns at maximum.

portion of address access time $t_{ACC}$. Therefore, address access time $t_{ACC}$ will not be influenced even if the charging and discharging speeds in the output buffer section of the output circuit are low. In contrast, since output buffer enable signal $\overline{OE}$ is supplied to the output circuit only via the $\overline{OE}$ buffer circuit, substantially all portion of time $t_{OE}$ is occupied by the delay time in the output circuit. Thus, the charging and discharging speeds in the output circuit become one of the most important factors for determining time $t_{OE}$.

For the reasons described above, even if address access time $t_{ACC}$ is delayed by 10 to 20 ns, it will not give as much influence to the entire operation speed as times $t_{OE}$ and $t_{PGM}$ is delayed by such time. However, if the charging and discharging speeds are lowered in order to suppress the influence due to noise, times $t_{OE}$ and $t_{PGM}$ are prolonged and will not satisfy the standard. With the fact described above taken into consideration, a output control circuit for delaying address access time $t_{ACC}$ and reducing times $t_{OE}$ and $t_{PGM}$ is used in this invention.

Figure 1:
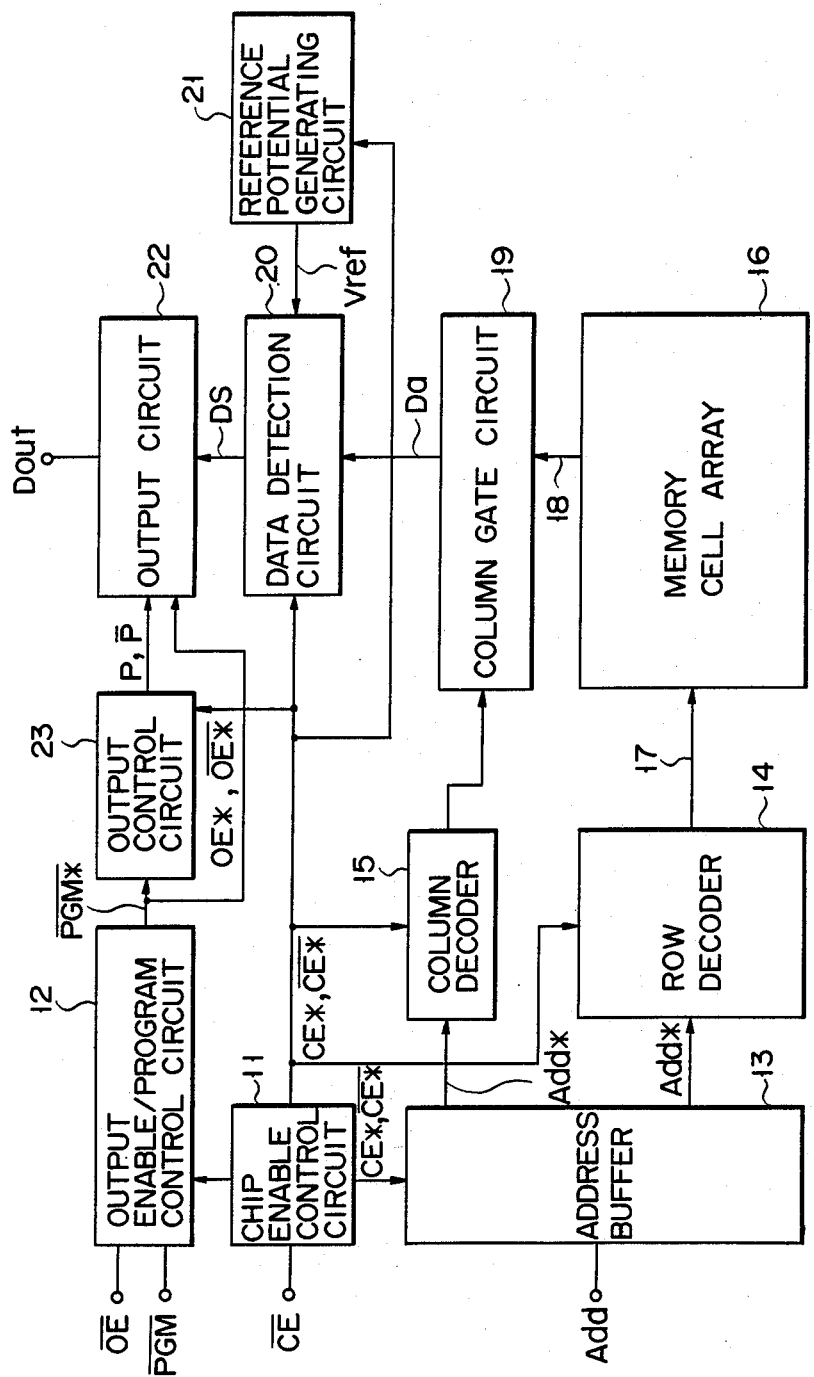
FIG. 1 is a block diagram showing the entire construction of a semiconductor memory device according to one embodiment of this invention.

FIG. 1 is a block diagram showing the entire construction of a semiconductor memory device (programmable read only memory) according to one embodiment of this invention. Chip enable control circuit 11 generates internal chip enable signals CE* and $\overline{CE^*}$ in response to chip enable signal $\overline{CE}$. Output enable/program control circuit 12 generates internal output enable signals OE* and $\overline{OE^*}$ and internal program signal $\overline{PGM^*}$ in response to externally supplied output enable signal OE and program signal $\overline{PGM}$. External address signal Add and internal chip enable signals CE* and $\overline{CE^*}$ are input to address buffer 13 which outputs internal address signal Add* when signals CE* and $\overline{CE^*}$ are activated.

TABLE 1

| | A.C. ELECTRICAL CHARACTERISTICS (Ta = −40~85° C., Vcc = 5 V ± 5%, Vpp = Vcc ± 0.6 V) | | | | | |
|---|---|---|---|---|---|---|
| | | TC 571000D-15/ TC 571001D-15 | | TC 571000D-20/ TC 571001D-20 | | |
| SYMBOL | ITEM | MIN | MAX | MIN | MAX | UNIT |
| $t_{ACC}$ | ADDRESS ACCESS TIME | — | 150 | — | 200 | ns |
| $t_{CE}$ | VARIATION OF $\overline{CE}$ TO DATA READOUT | — | 150 | — | 200 | ns |
| $t_{OE}$ | VARIATION OF $\overline{CE}$ TO DATA READOUT | — | 70 | — | 70 | ns |
| $t_{PGM}$ | VARIATION OF $\overline{PGM}$ TO DATA READOUT | — | 70 | — | 70 | ns |
| $t_{DF1}$ | VARIATION OF $\overline{CE}$ TO SET-UP OF HIGH OUTPUT IMPEDANCE | 0 | 60 | 0 | 60 | ns |
| $t_{DF2}$ | VARIATION OF $\overline{OE}$ TO SET-UP OF HIGH OUTPUT IMPEDANCE | 0 | 60 | 0 | 60 | ns |
| $t_{DF3}$ | VARIATION OF $\overline{PGM}$ TO SET-UP OF HIGH OUTPUT IMPEDANCE | 0 | 60 | 0 | 60 | ns |
| $t_{OH}$ | OUTPUT DATA HOLDING TIME | 0 | — | 0 | — | ns |

*A.C. test condition:
*output load: 1 TTL Gate and $C_L$ = 100 pF
*fall and rise times of input pulse: 10 ns MAX.
*input pulse level: 0.45 V to 2.4 V
*reference level for timing measurement: input 0.8 V and 2.2 V In general, the address input signal is supplied to the row decoder and column decoder via the address buffer. The row decoder functions to select a memory cell, and the readout data from the selected memory cell is supplied to the column line. The readout data supplied to the column line is further supplied to the data sensing circuit via the column gate which is selectively controlled by means of the column decoder. Data sensed by the data sensing circuit is supplied to the exterior by means of the output circuit.

In this way, address access time $t_{ACC}$ is the sum of delay time is such circuit blocks, so data transmission time in the output circuit section occupies only a small An internal address signal Add* output from address buffer 13 is supplied to row decoder 14 and column decoder 15. Internal chip enable signals CE* and $\overline{\text{CE*}}$ are also supplied to row decoder 14 and column decoder 15. Row decoder 14 is operated when chip enable signals CE* and $\overline{\text{CE*}}$ are activated, and selectively drives row line 17 in memory cell array 16 in response to internal address Add*. In memory cell array 16, data is read out from a plurality of memory cells (not shown) connected to row line 17. Data thus read out is input to column gate circuit 19 via column line 18.

Column decoder 15 is operated when chip enable signals CE* and $\overline{\text{CE*}}$ are activated, and controls the operation of column gate circuit 19 in response to internal address Add*. As a result of the control operation, column gate circuit 19 will select n bits out of m-bit data (m>n) read out from memory cell array 16. Then, n-bit data selected by column gate circuit 19 is input to data detection circuit 20. Data detection circuit 20 is connected to chip enable signals CE* and $\overline{\text{CE*}}$ and reference voltage Vref generated from reference potential generating circuit 21. Data detection circuit 20 is operated when signals CE* and $\overline{\text{CE*}}$ are activated, and determines data by comparing the data from column gate circuit 19 with reference voltage Vref. Data thus determined is input to output circuit 22.

Internal output enable signals OE* and $\overline{\text{OE*}}$ and internal program signal $\overline{\text{PGM*}}$ from output enable/program control circuit 12 and signals CE* and $\overline{\text{CE*}}$ from chip enable control circuit 11 are supplied to output control circuit 23. Output control circuit 23 detects variation in level of external output enable signal $\overline{\text{OE}}$ based on internal output enable signals OE* and $\overline{\text{OE*}}$, and produces pulses P and $\overline{\text{P}}$ with a preset pulse width. Pulse signals P and $\overline{\text{P}}$ are supplied together with internal output enable signals OE* and $\overline{\text{OE*}}$ to output circuit 22. Output circuit 22 is operated in response to pulse signals P and $\overline{\text{P}}$ and internal output enable signals OE* and $\overline{\text{OE*}}$ to supply data Dout of plural bits corresponding to detection data from data detection circuit 20 to the outside of the chip.

The memory device in this embodiment is similar to the conventional memory device except that output control circuit 23 is used and output circuit 22 is controlled by pulse signals P and $\overline{\text{P}}$ generated from output control circuit 23 in addition to internal output enable signals OE* and $\overline{\text{OE*}}$.

Figure 2:
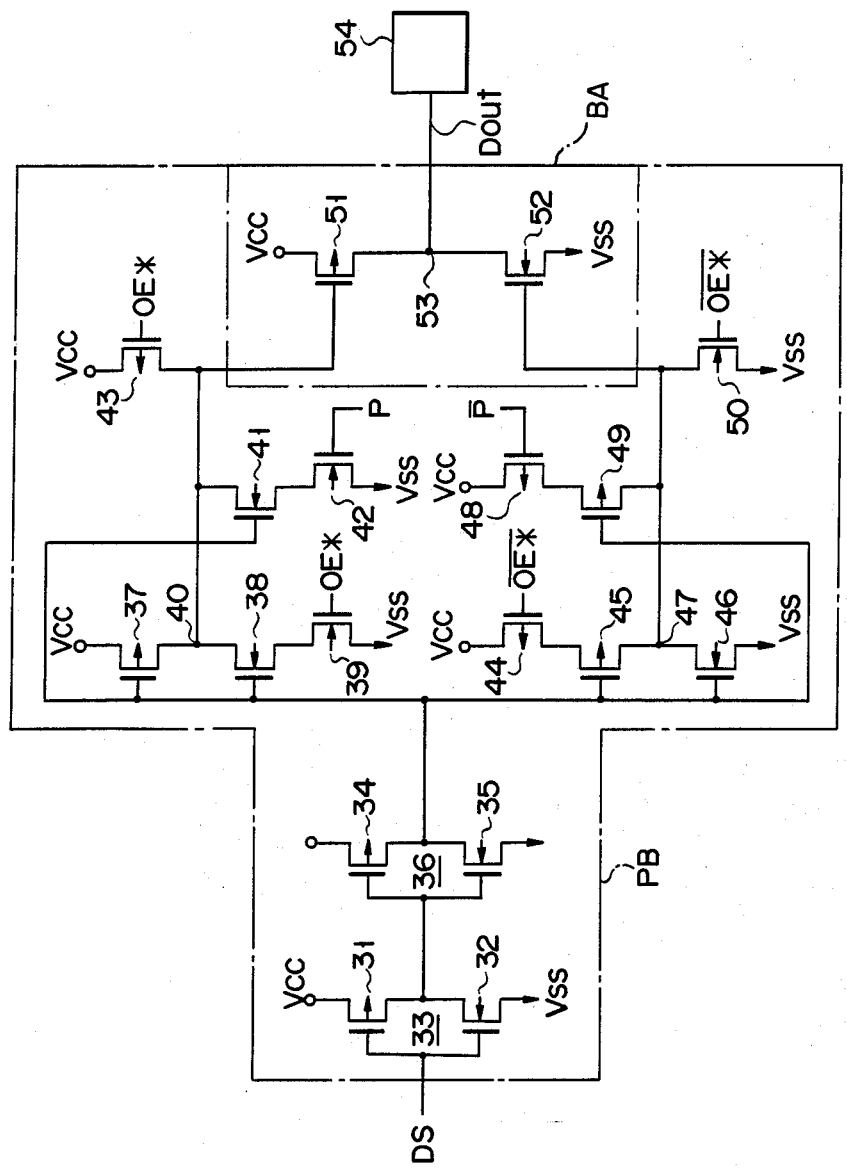
FIG. 2 is a circuit diagram showing the detail construction of part of an output circuit section in the device of FIG. 1.

FIG. 2 is a circuit diagram showing the construction of part of output circuit 22 included in the memory device shown in FIG. 1 which processes one-bit data. One-bit data DS detected by data detection circuit 20 is supplied to CMOS inverter 33 which is constituted by P-channel MOS transistor 31 and N-channel MOS transistor 32 having current paths connected in series between power source terminals Vcc and Vss (or ground). An output of inverter 33 is supplied to CMOS inverter 36 which is constituted by P-channel MOS transistor 34 and N-channel MOS transistor 35 having current paths connected in series between power source terminals Vcc and Vss.

Further, the current paths of P-channel MOS transistor 37 and two N-channel MOS transistors 38 and 39 are connected in series between power source terminals Vcc and Vss. The gates of P-channel MOS transistor 37 and N-channel MOS transistor 38 are connected to receive an output of inverter 36, and the gate of N-channel MOS transistor 39 is connected to receive internal output enable signal OE*. The current paths of two N-channel MOS transistors 41 and 42 are connected in series between power source terminal Vss and connection node 40 between P-channel MOS transistor 37 and N-channel MOS transistor 38. The gates of N-channel MOS transistors 41 and 42 are connected to receive an output of inverter 36 and pulse signal P, respectively. In addition, the current path of P-channel MOS transistor 43 whose gate is connected to receive internal output enable signal OE* is connected between node 40 and power source terminal Vcc.

Further, the current paths of two P-channel MOS transistors 44 and 45 and N-channel MOS transistor 46 are connected in series between power source terminals Vcc and Vss. The gates of P-channel MOS transistor 45 and N-channel MOS transistor 46 are connected to receive an output of inverter 36, and the gate of P-channel MOS transistor 44 is connected to receive internal output enable signal $\overline{\text{OE*}}$. The current paths of two P-channel MOS transistors 48 and 49 are connected in series between power source terminal Vcc and connection node 47 between P-channel MOS transistor 45 and N-channel MOS transistor 46. The gates of P-channel MOS transistors 48 and 49 are connected to receive pulse signal $\overline{\text{P}}$ and an output of inverter 36, respectively. In addition, the current path of N-channel MOS transistor 50 whose gate is connected to receive internal output enable signal $\overline{\text{OE*}}$ is connected between node 47 and power source terminal Vss.

Further, the current paths of P-channel MOS transistor 51 and N-channel MOS transistor 52 are connected in series between power source terminals Vcc and Vss. The gates of P-channel MOS transistor 51 and N-channel MOS transistor 52 are connected to nodes 40 and 47, respectively. In addition, data output terminal (or pad) 54 is connected to connection node 53 between transistors 51 and 52, and data Dout is supplied from terminal 54 to the exterior.

Two inverters 33 and 36, and transistors 37 to 50 constitute pre-amplifier section PB, and other transistors 51 and 52 constitute buffer amplifier section BA. In order to drive a load which is externally connected to terminal 54 with a sufficiently large current, P-channel MOS transistor 51 and N-channel MOS transistor 52 provided at the buffer amplifier BA are formed to have a conductance larger than that of the other transistors.

The operation mode of the PROM includes a programming mode in which data is programmed and a readout mode in which data is read out. The readout mode includes three modes: an output disable mode in which data is read out from a memory cell array in response to an address signal but is not supplied to the exterior, a standby mode in which data is not read out and an active mode in which readout data is supplied to the exterior.

Now, the operation of the memory device with the construction described above is explained.

Figure 3:
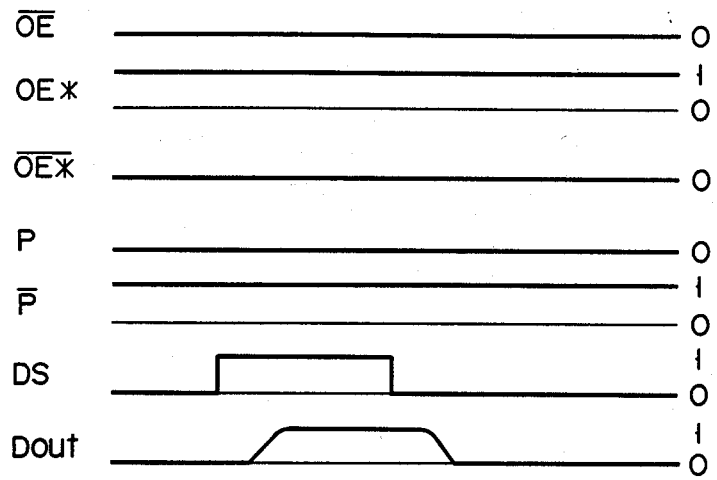
FIGS. 3 and 4 are timing charts for illustrating the operation of circuits shown in FIGS. 1 and 2.

In the active mode, externally supplied output enable signal $\overline{\text{OE}}$ and chip enable signal $\overline{\text{CE}}$ are previously set at "0" level. At this time, as shown by the timing chart of FIG. 3, internal output enable signals OE* and $\overline{\text{OE*}}$ are set at "1" and "0" levels, respectively. Pulse signals P and $\overline{\text{P}}$ output from output control circuit 23 are respectively set at "0" and "1" levels. Therefore, in the output circuit shown in FIG. 2, N-channel MOS transistor 39 is turned on, N-channel MOS transistor 42 is turned off, P-channel MOS transistor 43 is turned off, P-channel MOS transistor 44 is turned on, P-channel MOS transistor 48 is turned off, and N-channel MOS transistor 50 is turned off. As a result, an output of inverter 36 is supplied to the gate of P-channel MOS transistor 51 via a CMOS inverter constituted by P-channel MOS transistor 37 and N-channel MOS transistor 38, and to the gate of N-channel MOS transistor 52 via CMOS inverter constituted by P-channel MOS transistor 45 and N-channel MOS transistor 46.

In this case, if detection data DS of data detection circuit 20 is at "0". level, an output of inverter 33 is set to "1" level and an output of succeeding inverter 36 is set to "0" level. At this time, node 40 is charged by means of P-channel MOS transistor 37 and is set to "1" level. Node 47 is charged via the current paths of P-channel MOS transistors 44 and 45 and is set to "1" level. Therefore, N-channel MOS transistor 52 is turned on to set data Dout appearing at node 53 to "0" level.

Next, if address signal Add is changed and detection data DS from data detection circuit 20 is changed from "0" to "1" level, an output from inverter 36 is set from "0" to "1" level. As a result, node 40 which has been charged by means of P-channel MOS transistor 37 is now discharged via the serial current paths of N-channel MOS transistors 38 and 39, and the voltage level thereof is inverted to "0" level. At this time, node 47 which has been charged by means of P-channel MOS transistors 44 and 45 is now discharged via the current path of N-channel MOS transistor 46, and the voltage level thereof is also inverted to "0" level. In this way, after detection data DS is set to "1" level, P-channel MOS transistor 51 is turned on and data Dout of node 53 is inverted from "0" to "1" level. In this case, node 40 is discharged via the current paths of N-channel MOS transistors 38 and 39 at a relatively low discharging speed, and therefore data Dout rises slowly to "1" level.

Next, if address signal Add is changed again and detection data DS from data detection circuit 20 is set to "0" level, nodes 40 and 47 are set to "1" level. As a result, N-channel MOS transistor 52 is turned on and data Dout of node 53 is inverted to "0" level. In this case, node 47 is charged via the current paths of P-channel MOS transistors 44 and 45 at a relatively low charging speed, and therefore data Dout falls slowly to "0" level.

Figure 4:
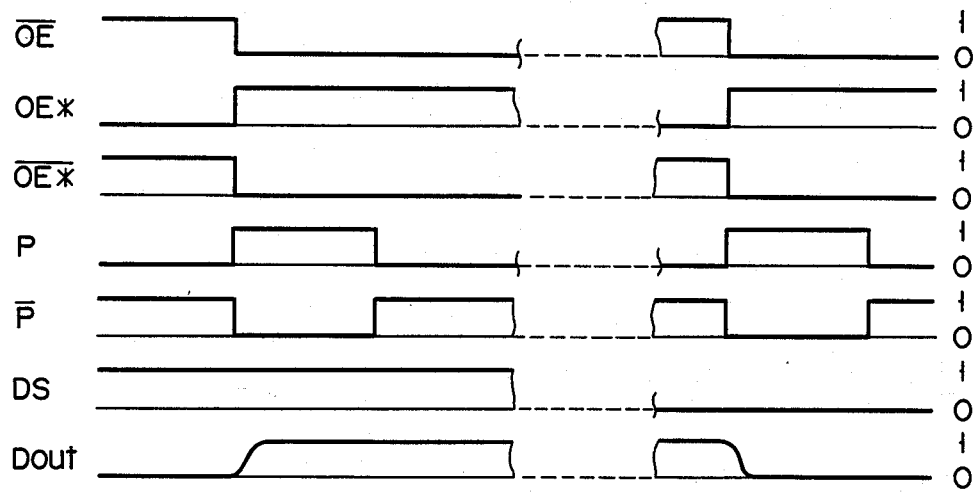

There will now be described the operation in the output disable mode. In this operation mode, data DS from data detection circuit 20 is previously determined by address signal Add, and data Dout is supplied from output circuit 22 by activating external output enable signal $\overline{OE}$. Assume now that detection data DS is at "1" level as shown in the timing chart of FIG. 4. At this time, an output of inverter 36 in FIG. 2 is at "1" level, P-channel MOS transistors 37 and 45 are set in the nonconductive state and N-channel MOS transistors 38 and 46 are set in the conductive state.

Then, if external output enable signal $\overline{OE}$ is set to "0" level, internal output enable signals OE* and $\overline{OE}$* are respectively set to "1" and "0" levels. As a result, N-channel MOS transistor 39 is turned on and P-channel MOS transistor 43 is turned off, causing node 40 to be discharged via the serial current paths of N-channel MOS transistors 38 and 39.

When it is detected by output control circuit 23 that signal $\overline{OE}$ is changed to "0" level, pulse signals P and $\overline{P}$ from control circuit 23 are respectively set at "1" and "0" levels for a preset period of time. When signal P is at "1" level, N-channel MOS transistor 42 is turned on. Since, at this time, N-channel MOS transistor 41 is set in the conductive state, node 40 will be discharged via the current paths of N-channel MOS transistors 41 and 42 in addition to those of N-channel MOS transistors 38 and 39. Therefore, the discharging speed at which node 40 is discharged to "0" level is enhanced in comparison with the case of the active mode. As a result, P-channel MOS transistor 51 is rapidly turned on, causing data Dout to rise rapidly to "1" level.

When output data DS of data detection circuit 20 is set at "0" level, an output of inverter 36 shown in FIG. 2 is also set at "0" level. Therefore, P-channel transistors 37 and 45 are turned on and N-channel transistors 38 and 46 are turned off. When signal $\overline{OE}$ is set to "0" level, internal output enable signals OE* and $\overline{OE}$* are respectively set to "1" and "0" levels. As a result, P-channel MOS transistor 44 is turned on and N-channel MOS transistor 50 is turned off, thereby causing node 47 to be charged via the current paths of P-channel MOS transistors 44 and 45.

At this time, since signal $\overline{P}$ is set at "0" level for a preset period of time, P-channel MOS transistor 48 is turned on. Since, in this case, P-channel MOS transistor 49 is set in the conductive state, node 47 is charged via the current paths of P-channel MOS transistors 48 and 49 in addition to the case of P-channel MOS transistors 44 and 45. Therefore, the charging speed at which node 47 is charged to "1" level is enhanced in comparison with the case of the active mode. As a result, N-channel MOS transistor 52 is rapidly turned on, causing data Dout to fall rapidly to "0" level.

In the standby mode, internal output enable signals OE* and $\overline{OE}$* are respectively set to "0" and "1" levels in response to signal $\overline{OE}$. At this time, P-channel MOS transistor 43 is turned on and N-channel MOS transistor 39 is turned off so that node 40 can be set to "1" level, unconditionally setting P-channel MOS transistor 51 into the nonconductive state. Further, when N-channel MOS transistor 50 is turned on and P-channel MOS transistor 44 is turned off, node 47 is set to "0" level, unconditionally setting N-channel MOS transistor 52 into the nonconductive state. As a result, node 53 is set into the high impedance (electrically floating) condition.

As described above, in the memory device of the above embodiment, data can be rapidly read out in the output disable mode in which high operation speed is required. In this case, address signal Add has been set and then a certain period of time has passed before signal $\overline{OE}$ is activated to supply data Dout to the exterior. Therefore, even if the power source voltage has varied due to noise generation, there is no possibility of the memory device being erroneously operated.

In the active mode, the discharging operation of node 40 and the charging operation of node 47 are effected at a slower speed than in the case of the output disable mode. Thus, current will not abruptly flow in P-channel MOS transistor 51 or N-channel MOS transistor 52, suppressing the occurrence of noise.

Figure 5:
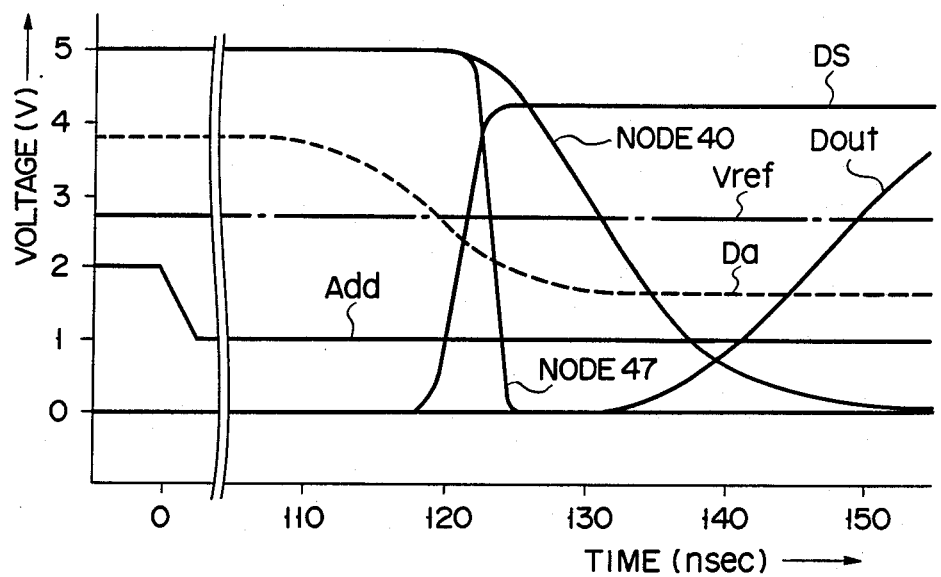
FIGS. 5 and 6 are voltage waveforms at respective portions of the circuit shown in FIGS. 1 and 2.
Figure 6:
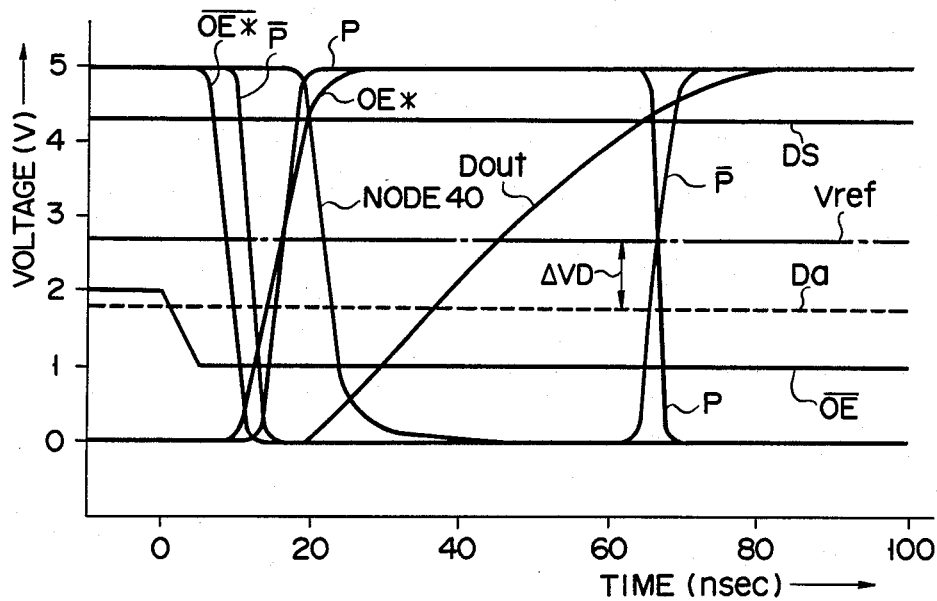

FIGS. 5 and 6 show the voltage waveforms at respective points in the memory device according to the above embodiment, FIG. 5 showing the case of the active mode and FIG. 6 showing the case of the output disable mode. Da shown in FIGS. 5 and 6 is output data of column gate circuit 19. As is clearly understood from FIGS. 5 and 6, output data Dout is rapidly rises to "1" level in the output disable mode than in the active mode.

FIG. 7 shows the waveforms of the signals which are generated in the circuit when the potential of node 40 and the potential of output signal Dout are rapidly lowered and raised, respectively. Data detection circuit 20 compares the data Da read from the memory cells, with the reference potential Vref, thus determining whether the data DS is at the "H" or "L" level. As is shown in FIG. 7, when the output circuit operates at high speed, the potential of node 40 starts falling, and the output node 53 is therefore charged, before the potential of the data Da deviates from the reference voltage Vref. As a result of this, a large current flows from the output buffer to the output terminal, and both the power source potential and the ground potential fluctuate. Consequently, noise is generated. The noise inverts the relationship in level between the reference potential Vref and the potential of data Da, which are not sufficient different from each other. The data Da becomes erroneous. More specifically, the potential of this data rises above the reference potential Vref since the noise is superposed on the data Da when $\Delta$VD is small immediately the potential of the data Da falls below potential Vref during the discharging of data Da. The sense amplifier detects this potential rise of data Da. Nonetheless, the difference $\Delta$VD between potential Vref and the potential of data Da remains sufficiently great since both the reference potential Vref and that of data Da are fixed during period $t_{OE}$ or period $t_{PGM}$, as is illustrated in FIG. 6. Hence, even if the reference potential Vref and that of data Da fluctuate because of the noise resulting from a large current flowing in the output circuit, no invention occurs in their level relationship. This is because internal enable signal OE* changes sufficiently long after the address has changed, as has been described above. Thus, the data Da is read out stably, and does not become erroneous. The output circuit can, therefore, operate at high speed during period $t_{OE}$ and period $t_{PMG}$. During period $t_{ACC}$, the output circuit operates at low speed. Thus, the generation of noise is suppressed during this period even if the potential difference $\Delta$VD is small, and the semiconductor integrated circuit makes no errors during period $t_{ACC}$, too.

Figure 8:
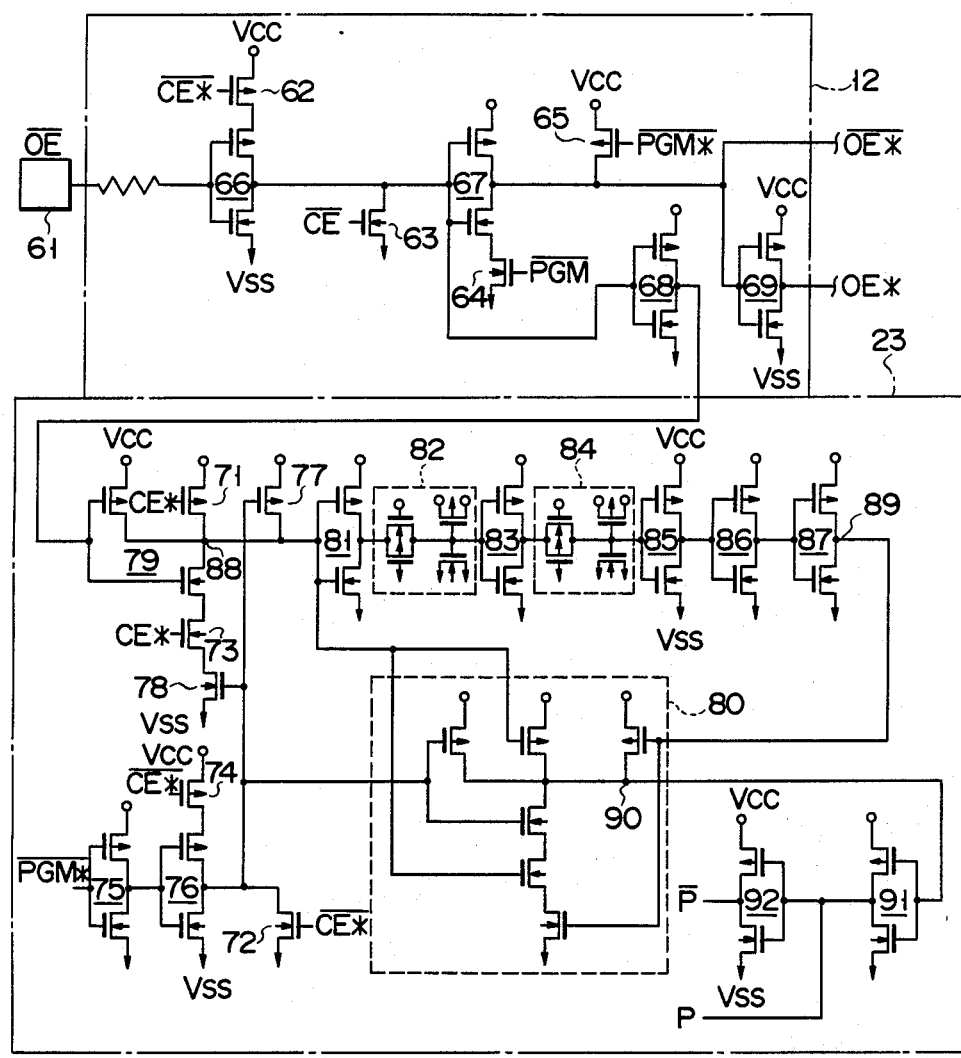
FIG. 8 is a circuit diagram showing the detail construction of an output enable/program control circuit and an output control circuit in the device of FIG. 1.

FIG. 8 is a circuit diagram showing the detail construction of output enable/program control circuit 12 and output control circuit 23 in the memory device of the above embodiment. Pad or terminal 61 is connected to receive signal $\overline{OE}$. When internal program signal $\overline{PGM^*}$ is at "1" level and signal $\overline{CE^*}$ is at "0" level, P-channel MOS transistor 62 is turned on, N-channel MOS transistor 63 is turned off, N-channel MOS transistor 64 is turned on and P-channel MOS transistor 65 is turned off in output enable/program control circuit 12. Therefore, signal $\overline{OE}$ supplied to terminal 61 is supplied as output enable OE* via CMOS inverters 66 and 67, and output as internal output enable signal $\overline{OE^*}$ via CMOS inverter 69.

When signals CE* and $\overline{CE^*}$ are respectively set at "1" and "0" levels, P-channel MOS transistor 71 and N-channel MOS transistor 72 are turned off and N-channel MOS transistor 73 and P-channel MOS transistor 74 are turned on in output control circuit 23. At this time, an output of CMOS inverter 75 to which signal $\overline{PGM^*}$ is supplied is set to "0" level, and an output of succeeding CMOS inverter 76 is set to "1" level. The output of CMOS inverter 76 is supplied to the gates of P-channel MOS transistor 77 and N-channel MOS transistor 78 to turn off P-channel MOS transistor 77 and turn on N-channel MOS transistor 78. Therefore, an output signal of inverter 68 in circuit 12 is supplied to CMOS NAND circuit 80 including P- and N-channel MOS transistors via CMOS NAND circuit 79 which functions as an inverter. Further, an output signal of NAND circuit 79 is supplied to CMOS NAND circuit 80 via CMOS inverter 81, signal delay circuit 82 including P- and N-channel MOS transistors, CMOS inverter 83, signal delay circuit 84 with the same construction as signal delay circuit 82 and three CMOS inverters 85 to 87. A signal on output node 88 of NAND circuit 79 and that on output node 89 of inverter 87 are generated with a certain time delay from each other and are set in the inverted logic states. Therefore, a pulse signal which is set to "0" level only when signals on nodes 88 and 89 are both set at "1" level is generated from output node 90 of NAND circuit 80. The pulse signal is supplied as pulse signal P via CMOS inverter 91 and as pulse signal $\overline{P}$ via CMOS inverters 91 and 92.

Figure 9:
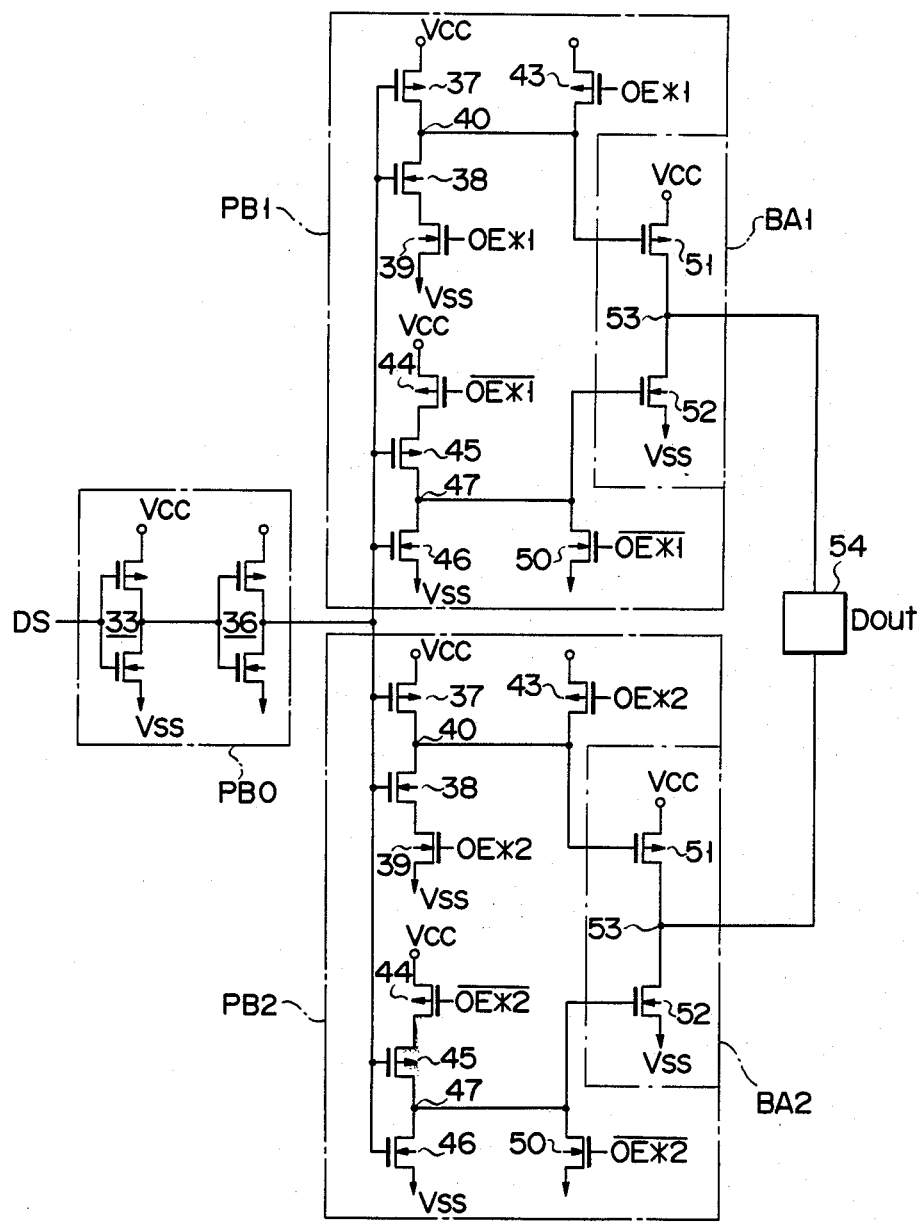
FIG. 9 is a circuit diagram showing another detail construction of the output circuit shown in FIG. 2.

FIG. 9 is a circuit diagram showing the construction of part of output circuit 22 which is provided in the memory device shown in FIG. 1 and which processes one bit of data. This output circuit has two output sections PB1 and PB2, both corresponding to pre-amplifier section PB shown in FIG. 2. The output signal of the PBO, which is equivalent to the input of pre-amplifier section PB, is supplied to output sections PB1 and PB2. The outputs of these sections PB1 and PB2 are input to two buffer amplifier sections BA1 and BA2, respectively. Pre-amplifier sections PB1 and PB2 are formed to have the construction obtained by omitting N-channel MOS transistors 41 and 42 and P-channel MOS transistors 48 and 49 from pre-amplifier section BA shown in FIG. 2. One of pre-amplifier section BA1 is connected to receive signals OE*1 and $\overline{OE^*1}$ instead of internal output enable signals OE* and $\overline{OE^*}$, and the other pre-amplifier section PB2 is connected to receive signals OE*2 and $\overline{OE^*2}$ instead of internal output enable signals OE* and $\overline{OE^*}$. Output nodes 53 of buffer amplifier sections BA1 and BA2 are connected to terminal 54. Two sets of signals OE*1 and $\overline{OE^*1}$ and signals OE*2 and $\overline{OE^*2}$ are generated at different timings from output control circuit 23.

In the output circuit with the construction described above, as shown by the timing chart of FIG. 10, internal output enable signals OE*1 and $\overline{OE^*1}$ are respectively set from "0" and "1" levels to "1" and "0" - levels after external output enable signal $\overline{OE}$ is activated and changed to "0" level. Therefore, buffer amplifier section BA1 is continuously operated after signal $\overline{OE}$ has been activated.

Internal output enable signals OE*2 and $\overline{OE^*2}$ are set at "1" and "0" levels respectively for a preset period of time after signal $\overline{OE}$ has been activated. Thus, buffer amplifier section BA2 is operated for a preset period of time after signal $\overline{OE}$ has been activated. Then, signal OE*2 and $\overline{OE^*2}$ are set to "1" and "0" levels, respectively. As a result, the operation speed of charging or discharging node 54 is enhanced and data can be read out at a higher speed in a period of time in which buffer amplifier section BA2 than in a case in which only buffer amplifier section BA1 is operated. However, in this case, the number of stages of the buffer amplifier sections is increased and therefore the output circuit becomes easily influenced by power source noise in comparison with the output circuit shown in FIG. 2.

In the embodiment shown in FIG. 9, output section PB1 and buffer amplifier section BA1 have a response speed different from that of output section PB2 and buffer amplifier section BA2. Output section PB1 and buffer amplifier section BA1 have the same response speed when transistors 44 and 48 (both shown in FIG. 2) are off. Therefore, nodes 40 and 47 of buffer amplifier section BA1 are slowly discharged and charged, respectively, whereas nodes 40 and 47 of buffer amplifier section BA2 are quickly discharged.

Substantially the same effect and operation of the circuit shown in FIG. 2 can be obtained by the circuit of FIG. 9.

The sway in the power source voltage is caused by the presence of parasitic inductance associated with the wiring layer of the power source line. That is, in a case where the output thermal is charged or discharged from the power source by means of the output buffer transistor, potential fluctuation $\Delta V$ in the power source wiring line can be expressed as follows:

$$\Delta V = Lx \cdot di/dt \tag{1}$$

where di/dt denotes variation in the current flowing in the output buffer transistor and power source wiring line and Lx denotes the inductance of the power source wiring line. Potential fluctuation $\Delta V$ is the cause of power source noise generation. As is clearly understood from equation (1), $\Delta V$ becomes small as di/dt is set to be smaller, reducing the fluctuation in the power source voltage and suppressing noise generation.

Assume now that the output terminal which has been charged to the power source potential is discharged. In this case, after the gate potential of the transistor which has been set at the power source potential is raised to the power source potential by the drain voltage, the output terminal is discharged. Therefore, di/dt is influenced by the current-voltage characteristic of the transistor. After the discharging operation is operated, the output buffer transistor is operated in the saturation region until the drain voltage becomes lower than the gate voltage by the threshold voltage. It is well known in the art that the voltage-current characteristic of the MOS transistor in the saturation region can be expressed by the following equation:

$$ID = \frac{W \cdot Cox \cdot \mu}{L \cdot 2} (VG - Vth)^2 \tag{2}$$

where L denotes the channel length, W the channel width, Cox the gate capacitance for each unit area, $\mu$ the mobility of electrons, VG the gate voltage, and Vth the threshold voltage.

Assume now that gate voltage VG starts to rise. In this case, in order to simplify the explanation, assume that gate voltage VG rises linearly with respect to time. Thus, if gate voltage VG rises with inclination $\Delta X$ with respect to time, gate voltage VG can be expressed as follows:

$$VG = \Delta X \cdot t \tag{3}$$

The following equation can be obtained by substituting equation (3) into equation (2):

$$ID = \frac{W \cdot Cox \cdot \mu}{L \cdot 2} (\Delta X \cdot t - Vth)^2 \tag{4}$$

The rate of charge in current with time can be obtained by differentiating equation (4) with respect to time t, and dID/dt can be obtained as follows:

$$dID/dt = \frac{W \cdot Cox \cdot \mu}{L} (\Delta X^2 \cdot t - \Delta X \cdot Vth) \tag{5}$$

As is clearly seen from equation (5), the rate of change in current dID/dt varies in proportion to the square of $\Delta X$ which is the rising inclination of the gate voltage and varies in proportion to channel width W of the transistor. Therefore, the rate of change in current di/dt at the data output time can be more effectively reduced by making gentle the rising inclination of the gate voltage of the transistor to be turned on as shown in FIG. 2 than by reducing the channel width of the transistor to be turned on. Assume now that the potential of the output terminal is gradually discharged, the drain voltage of the output buffer transistor is gradually lowered and the transistor is operated in the triode operation mode. For brief explanation, assume that the voltage-current characteristic of the MOS transistor operation in the triode operation mode can be approximately expressed in the form of linear function which is attained by resistance R. Then, the relation between drain voltage VD and current ID can be expressed as follows:

$$ID = \frac{1}{R} \cdot VD \tag{6}$$

If the charge stored in capacitor C whose initial voltage is Vo is discharged via resistor R, voltage VD at time t can be expressed as follows:

$$VD = Vo \cdot e^{-\frac{t}{CR}} \tag{7}$$

The following equation can be obtained by substituting equation (7) into equation (6):

$$ID = \frac{1}{R} \cdot VD = \frac{1}{R} \cdot Vo \cdot e^{-\frac{t}{CR}} \tag{8}$$

Further, the following equation can be obtained by differentiating equation (8) with respect to time t:

$$dID/dt = -\frac{1}{CR^2} \cdot Vo \cdot e^{-\frac{t}{CR}} \tag{9}$$

As can be seen from equation (9), di/dt in the triode operation mode varies with the square of resistance R and has a negative value. That is, as shown in equation (1), the power source voltage will fluctuate in a negative direction. The resistance of the MOS transistor becomes larger as the channel width thereof is set to be smaller. That is, in the discharging operation in the triode operation mode after the gate voltage has been raised to the power source voltage, fluctuation in the power source voltage can be suppressed to a small value if the channel width is set to be small. Further, as described above, the effects can be obtained in proportion to the square of the channel width.

In general, the conduction resistance of the MOS transistor is determined by the channel width, and at the same time, depends on the gate voltage thereof. That is, the conduction resistance becomes smaller as the gate voltage becomes higher.

Figure 11:
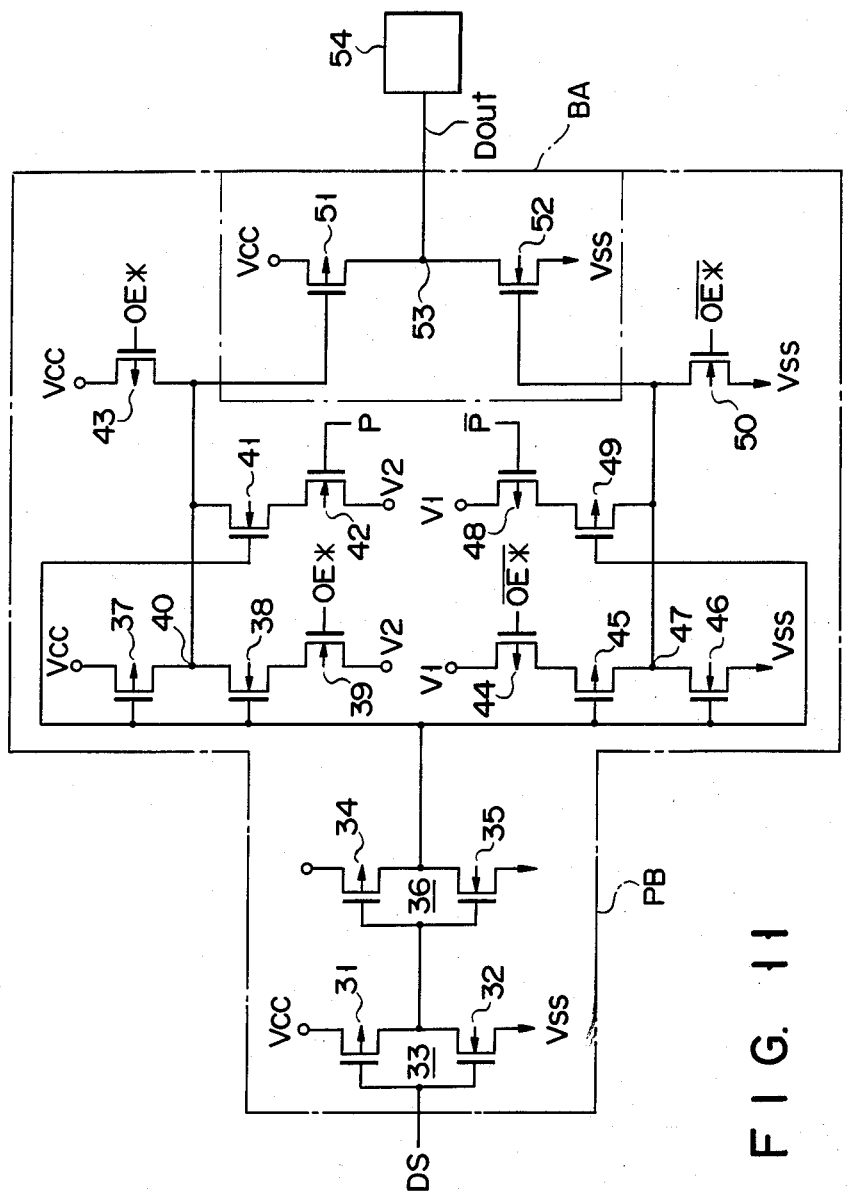
FIGS. 11 to 13 are circuit diagrams showing still another construction of the output circuit shown in FIG. 2.

FIG. 11 is a circuit diagram showing the circuit which is constituted by taking the above effect into consideration so as to improve the circuit of FIG. 2. In the circuit of FIG. 11, voltage V1 is used to obtain a voltage lower than power source voltage Vcc by a preset voltage and voltage V2 is used to obtain a voltage higher than power source voltage Vss by a preset voltage. In the operation in the saturation region at the data output time, the rate of change in the gate voltage of the output buffer MOS transistor is reduced to improve di/dt. In the triode mode operation, the gate voltage of the output buffer MOS transistor is set to be lower than Vcc or higher than Vss so as to increase the conduction resistance of the MOS transistor, thus improving di/dt. In this case, it is possible to provide V1 and V2 only in transistors 44 and 39. This is because transistors 42 and 48 are set in the nonconductive state in a period in which it is necessary to reduce di/dt and which ranges from the change of address in the state in which signal $\overline{OE}$ is set to "0" level to the data output time.

Figure 12:
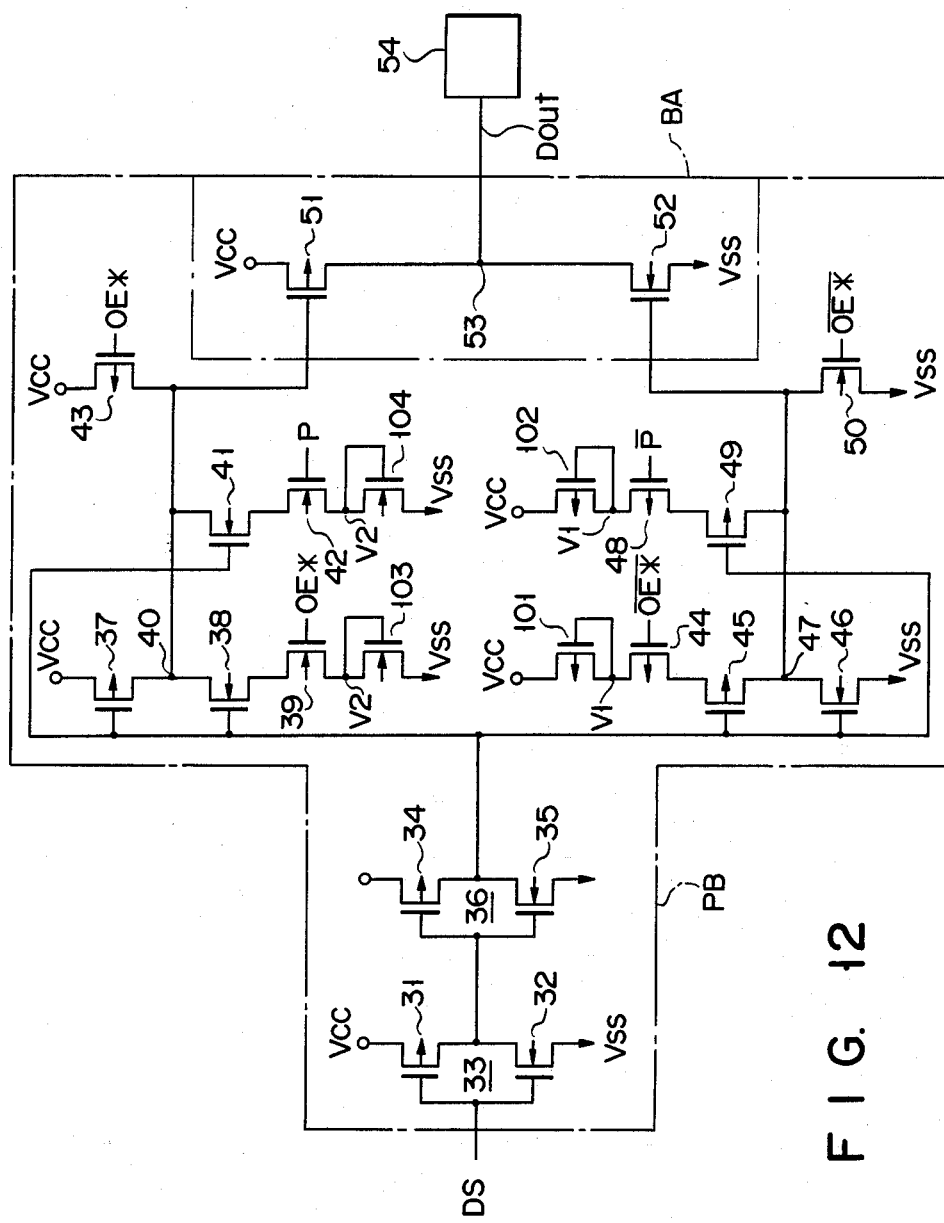

FIG. 12 is a circuit diagram showing the circuit of FIG. 11 for generating voltages V1 and V2. Voltage V1 is generated by means of P-channel MOS transistor 101 and 102 whose gate and drain are connected together respectively, and voltage V2 is generated by means of N-channel MOS transistor 103 and 104 whose gate and drain are connected together respectively. With this construction, a voltage which is lower than power source voltage Vcc by the threshold of the P-channel MOS transistor is supplied to MOS transistors 44 and 48, and a voltage which is higher than ground voltage Vss by the threshold voltage of the N-channel MOS transistor is supplied to MOS transistors 39 and 42.

In the example described above, the output voltage is set to have a potential difference equal to the threshold voltage of the MOS transistor, but it is possible to adjust the potential difference according to required di/dt.

Figure 13:
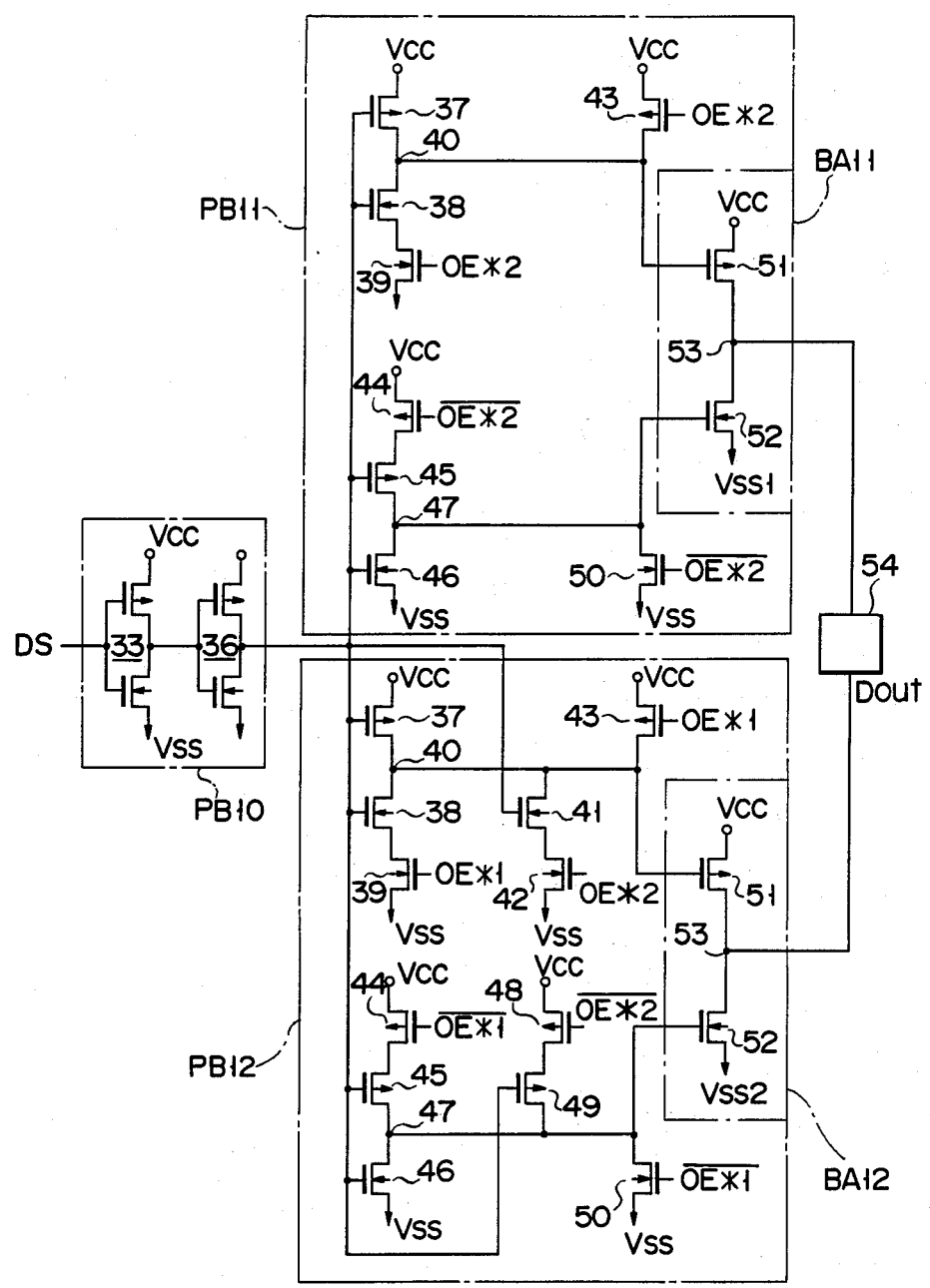

FIG. 13 is a circuit diagram showing another construction of part of output circuit 22 which is provided in the memory device shown in FIG. 1 and which processes one bit of data. This output circuit has two output sections PB11 and PB12, both corresponding to preamplifier section PB shown in FIG. 2. The output signal of the PB10, which is equivalent to the input of preamplifier section PB, is supplied to output sections PB11 and PB12. The outputs of these sections PB11 and PB12 are input to two buffer amplifier sections BA11 and BA12, respectively. Each of buffer amplifier sections BA11 and BA12 is similar to buffer amplifier section BA of FIG. 2 except that N-channel MOS transistor 52 of buffer amplifier section BA11 is connected to ground terminal Vss1 and N-channel MOS transistor 52 of buffer amplifier section BA12 is connected to ground terminal Vss2. Ground terminal Vss1 or Vss2 can also be used as another ground terminal Vss.

In the circuit of the embodiment shown in FIG. 13, data can be output at a high speed by operating BA11 and BA12 when signal $\overline{OE}$ is set at "0" level to derive out data. When address is changed to output new data with signal $\overline{OE}$ kept at "0" level, BA12 is operated. At this time, signals OE*2 and $\overline{OE}$*2 are respectively set at "0" and "1" levels, and therefore variation in the gate voltage of output transistors 51 and 52 becomes gentle as in the case of the circuit shown in FIG. 2. That is, in the circuit of FIG. 13, in the saturation operation effected before data is output, the rate of change in the gate voltage is set small to suppress di/dt to a small value. Further, in the triode operation mode, only the transistor of BA12 is used to drive the output terminal and therefore the resistance thereof in the charging and discharging operations may be set to be large, suppressing di/dt to a small value. If, for example, data out put speeds attained when signal $\overline{OE}$ is set to "0" level are equal to each other in the circuits of FIGS. 2 and 13, di/dt obtained in the triode operation mode when the address is changed with signal $\overline{OE}$ kept at "0" level will be more improved in the circuit of FIG. 13.

In this circuit, two different power source terminals Vss are used to distribute the total amount of current flowing into the power source terminals Vss, and therefore, variation in the power source voltage can be suppressed to a smaller value in comparison with the case where only one power source terminal Vss is used, and erroneous operation can be effectively prevented. Further, if the power source for the circuit section in which noise may be generated is separated from the power source for the circuit section which may be easily influenced by noise, influence by noise can be reduced. Two or more power sources Vcc can be provided, as well as two or more power sources Vss.

In general some of EPROMs (erasable PROM) such as a 1M-bit EPROM with 40 pins which is a sort of PROM includes two ground terminals. In such a case, ground terminals of the buffer amplifier sections in the output circuit may be divided as shown in FIG. 13 so as to suppress noise. One of previously prepared two ground lines is connected to terminals Vss1 and Vss2 which are respectively connected to transistor 52 of buffer amplifier section BA11 and transistor 52 of buffer amplifier section BA12, and the other ground line is connected to terminal Vss of FIG. 13 terminal Vss outside the buffer amplifier section. As a result of this, influence due to variation in the power source voltage caused by the discharging of Dout at the time of changing data will not be given to the circuit which is connected to the other terminal Vss. Therefore, erroneous operation of the circuit can be effectively prevented. Further, in a case where three or more ground lines are used, noise can be more effectively suppressed if the ground terminal of the buffer amplifier section is divided into a plurality of terminals. Further, if the power source for the circuit section in which noise may be generated is separated from the power source for the circuit section which may be easily influenced by noise, erroneous operation caused by noise can be reduced.

As described above, according to the above embodiment, output data can be supplied at a high speed when the high operation speed is required and the output data can be supplied at a low speed when it is required to suppress the noise occurrence.

This invention has been described with reference to the embodiments, but is to limited to the embodiments and can be variously modified. In the embodiments described above, use is made of either the first-type transistor which raises the potential of the output node toward power source Vcc level when it is turned on, or the second-type transistor which lowers the potential of the output node toward power source Vss level when it is turned on. The first-type transistor is used when the semiconductor integrated circuit includes a circuit which is more likely to make errors when power source voltage Vss changes than when power source voltage Vss changes. The second-type transistor is used when the semiconductor integrated circuit includes a circuit which is more likely to make errors when power source voltage Vss changes than when power source voltage Vcc changes. In the above embodiment, this invention is applied to the semiconductor memory device, but this invention can be applied to any semiconductor integrated circuit having an output circuit. With the use of this invention, it becomes possible to hold the high operation speed in selected circuit sections even if the average operation speed is lowered, and to enhance the reliability by selectively lowering the operation speed of circuit sections which are easily influenced by noise.

Further, if the power source for the circuit section in which noise may be generated is separated from the power source for the circuit section which may be easily influenced by noise, the operation reliability of the circuit section which may be easily influenced by noise can be enhanced. This invention is not limited to the embodiment described above, and can be variously modified.

As described above, according to this invention, a semiconductor integrated circuit can be provided in which the high operation speed and noise reduction in the output circuit can be attained at the same time.

What is claimed is:

1. A semiconductor integrated circuit comprising:
   an output circuit including a transistor whose conduction state is controlled according to an internal signal and charging and discharging a preset node by controlling the conduction state of said transistor, thus outputting a signal; and
   control means for increasing a rate of reduction in the conduction resistance of said transistor for a preset period of time after the control signal has changed in level.

2. A semiconductor integrated circuit according to claim 1, wherein said output circuit includes a signal output terminal; a first output section operated after the level of the control signal is changed, and charging and discharging said output terminal according to the internal signal to output a corresponding signal; and a second output section operated only in a preset period of time after the level of the control signal is changed, and charging and discharging said output terminal according to the internal signal to output a corresponding signal; and the power source sections for the buffer transistors of said first and second output sections are separated from each other.

3. A semiconductor integrated circuit comprising:
   a data output circuit including a transistor whose conduction state is controlled according to readout data and charging and discharging a preset node at a predetermined rate by controlling the conduction state of said transistor, thus outputting memory cell data; and
   control means for charging or discharging the preset node of said data output circuit at a rate different from the predetermined rate for a preset period of time after an output enable signal has changed in level.

4. A semiconductor integrated circuit according to claim 3, wherein said output circuit includes a data output terminal; a first data output section operated after the level of the enable signal is changed, and charging and discharging said output terminal according to the internal data to output a corresponding signal; and a second data output section operated only in a preset period of time after the level of the enable signal is changed, and charging and discharging said output terminal according to the internal data to output a corresponding signal; and the power source sections for the buffer transistors of said first and second data output sections are separated from each other.

5. A semiconductor integrated circuit comprising:
   an output circuit including an output node and at least two output transistors each having a drain, a source, and a gate, one of said transistors charges the output node, and the other of said transistors discharges the output node; and
   control means for changing the speed at which the potential of the gate of at least one of said output transistors varies.

6. A semiconductor integrated circuit according to claim 5, wherein said control means includes a switching transistor for charging or discharging the gates of said output transistors, and said speed is changed by changing the effective channel width of the switching transistor.

7. A semiconductor integrated circuit according to claim 6, wherein said switching transistor is replaced by a plurality of switching transistors, and the number of said switching transistors which are simultaneously used to charge or discharge the gate of said output transistor, thereby to change said effective channel width.

8. A semiconductor integrated circuit according to claim 6 or 7, wherein said control means includes pulse signal generating means for generating a pulse signal when a control signal changes to a higher level or a lower level, and the pulse signal is used to change said effective channel width.

9. A semiconductor integrated circuit according to claim 8, wherein said control means turns off said output transistor when said control signal at a first logic level, and turns on said output transistor when said control signal rises or falls from said first logic level.

10. A semiconductor integrated circuit according to claim 5, wherein said output circuit includes a first transistor of a first channel type having a current path connected between said output node and a first potential-applying means, and a second transistor of a second channel type having a current path connected between said output node and a second potential-applying means; and said control means includes first charging-/discharging control means for charging or discharging a first node connected to the gate of said first transistor, after the level of said control signal has changed, in accordance with detection data and inverting an internal enable signal, second charging/discharging control means for charging or discharging a second node connected to the gate of said second transistor, after the level of said control signal has changed, in accordance with the detection data and the internal enable signal, discharging control means for discharging said first node in accordance with the detecting data and a pulse signal during a predetermined period after the level of said control signal has changed, and charging control means for charging said second node in accordance with the detecting data and a signal obtained by inverting the pulse signal, during said predetermined period.

11. A semiconductor integrated circuit according to claim 10, wherein said internal enable signal, the inverted internal enable signal, the pulse signal, and the inverted pulse signal are generated in accordance with said control signal.

12. A semiconductor integrated circuit according to claim 5, wherein said output transistors are of opposite channel types.

13. A semiconductor integrated circuit according to claim 5, further comprising a first potential-applying means for applying a first potential, and a second potential-applying means for applying a first potential, and wherein said control means includes a third potential-applying means for applying a third potential which is somewhere between the first and second potentials.

14. A semiconductor integrated circuit according to claim 13, wherein said control means includes a plurality of switching transistors for charging or discharging the gate of said output transistor, only some of the switching transistors are used to charge or discharge the gate of said output transistor, thereby to reduce said speed, while the remaining switching transistors charge or discharge the gate of said output transistor at said third potential.

15. A semiconductor integrated circuit according to claim 13 or 14, wherein said third potential-applying means comprises a transistor having a source connected to said first or second potential-applying means, a drain, and a gate connected to the drain.

16. A semiconductor integrated circuit according to claim 5, wherein said output circuit includes a first transistor of a first channel type having a current path connected between said output node and a first potential-applying means, and a second transistor of a second channel type having a current path connected between said output node and a second potential-applying means; and said control means includes first charging-/discharging control means for charging or discharging a first node connected to the gate of said first transistor, after the level of said control signal has changed, in accordance with detection data and inverting an internal enable signal, second charging/discharging control means for charging or discharging a second node connected to the gate of said second transistor, after the level of said control signal has changed, in accordance with the detection data and the internal enable signal, a third potential-applying means for applying a potential to said first charging/discharging means, said potential being higher than the potential applied from said second potential-applying means by a predetermined value, a fourth potential-applying means for applying a potential to said second charging/discharging means, said potential being lower than the potential applied from said first potential-applying means by a predetermined value, discharging control means for discharging said first node in accordance with the detecting data and a pulse signal during a predetermined period after the level of said control signal has changed, and charging control means for charging said second node in accordance with the detecting data and a signal obtained by inverting the pulse signal, during said predetermined period.

17. A semiconductor integrated circuit according to claim 5, wherein said output circuit includes a first transistor of a first channel type having a current path connected between said output node and a first potential-applying means, and a second transistor of a second channel type having a current path connected between said output node and a second potential-applying means; and said control means includes first charging-/discharging control means for charging or discharging a first node connected to the gate of said first transistor, after the level of said control signal has changed, in accordance with detection data and inverting an internal enable signal, second charging/discharging control means for charging or discharging a second node connected to the gate of said second transistor, after the level of said control signal has changed, in accordance with the detection data and the internal enable signal, a third potential-applying means for applying a potential to said first charging/discharging means, said potential being higher than the potential applied from said second potential-applying means by a value determined by the threshold voltage of a transistor, a fourth potential-applying means for applying a potential to said second charging/discharging means, said potential being lower than the potential applied from said first potential-applying means by the value determined by the threshold voltage of a transistor, discharging control means for discharging said first node in accordance with the detecting data and the pulse signal during a predetermined period after the level of said control signal has changed, and charging control means for charging said second node in accordance with the detecting data and a signal obtained by inverting the pulse signal, during said predetermined period.

18. A semiconductor integrated circuit according to claim 5, wherein said output circuit includes a first transistor of a first channel type having a current path connected between said output node and a first potential-applying means, a second transistor of a second channel type having a current path connected between said output node and a second potential-applying means, a third transistor of the first channel type having a current path connected between said output node and the first potential-applying means, and a fourth transistor of the second channel type having a current path connected between said output node and said second potential-applying means; and said control means includes first charging/discharging control means for charging or discharging a first node connected to the gate of said first transistor, after the level of said control signal has changed, in accordance with detection data and a signal obtained by inverting a first internal enable signal, second charging/discharging control means for charging or discharging a second node connected to the gate of said second transistor, after the level of said control signal has changed, in accordance with the detection data and the first internal enable signal, third charging/discharging control means for charging or discharging a third node connected to the gate of said third transistor, after the level of said control signal has changed, in accordance with the detection data and a signal obtained by inverting a second internal enable signal, fourth charging/discharging control means for charging or discharging a fourth node connected to the gate of said fourth transistor, after the level of said control signal has changed, in accordance with the detection data and the second internal enable signal, discharging control means for discharging said third node in accordance with the detecting data and the pulse signal during a predetermined period after the level of said control signal has changed, and charging control means for charging said fourth node in accordance with the detecting data and a signal obtained by inverting the pulse signal, during said predetermined period.

19. A semiconductor integrated circuit according to claim 5, wherein said output circuit includes a first transistor of a first channel type having a current path connected between said output node and a first potential-applying means, a second transistor of a second channel type having a current path connected between said output node and a second potential-applying means, a third transistor of the first channel type having a current path connected between said output node and the first potential-applying means, and a fourth transistor of the second channel type having a current path connected between said output node and said second potential-applying means; and said control means includes first charging/discharging control means for charging or discharging a first node connected to the gate of said first transistor, after the level of said control signal has changed, in accordance with detection data and a signal obtained by inverting a first internal enable signal, second charging/discharging control means for charging or discharging a second node connected to the gate of said second transistor, after the level of said control signal has changed, in accordance with the detection data and the first internal enable signal, third charging/discharging control means for charging or discharging a third node connected to the gate of said third transistor, after the level of said control signal has changed, in accordance with the detection data and a signal obtained by inverting a second internal enable signal, fourth charging/discharging control means for charging or discharging a fourth node connected to the gate of said fourth transistor, after the level of said control signal has changed, in accordance with the detection data and the second internal enable signal.

20. A semiconductor integrated circuit comprising: an output circuit including an output node, a first output section for charging the output node in response to an internal signal, and a second output section for discharging the output node, at least one of said output sections having at least two transistors each having a source-drain current path connected at one end to said output node;

control means for turning off said transistors when a control signal is at a first logic level, turning on said transistors in response to the internal signal after the level of said control signal has changed from the first logic level to a second logic level, and turning off at least one of said transistors upon lapse of a predetermined period after the level of said control signal has changed from the first logic level to a second logic level, thereby to differentiate the response speeds of said transistors and/or the speeds at which the gate voltages of said transistors change.

21. A semiconductor integrated circuit according to claim 5, 14 or 20, further comprising an array of memory cells, a row decoder and a column decoder which cooperate to select the memory cells, and data detecting circuit detecting data stored in any memory cell selected by the row and column decoders.

22. A semiconductor integrated circuit according to claim 21, wherein said control signal is generated from an output enable signal externally input to the semiconductor integrated circuit.

23. A semiconductor integrated circuit according to claim 8, further comprising an array of memory cells, a row decoder and a column decoder which cooperate to select the memory cells, and data detecting circuit detecting data stored in any memory cell selected by the row and column decoders.

24. A semiconductor integrated circuit according to claim 23, wherein said control signal is generated from an output enable signal externally input to the semiconductor integrated circuit.

* * * * *

REEXAMINATION CERTIFICATE (1949th)
United States Patent [19]

Tatsumi et al.

[11] B1 4,882,507

[45] Certificate Issued Mar. 16, 1993

[54] OUTPUT CIRCUIT OF SEMICONDUCTOR INTEGRATED CIRCUIT DEVICE

[75] Inventors: Yuuichi Tatsumi, Tokyo; Hidenobu Minagawa, Kawasaki; Hiroshi Iwahashi, Yokohama; Masamichi Asano, Tokyo; Mizuho Imai, Annaka, all of Japan

[73] Assignee: Kabushiki Kaisha Toshiba, Kawasaki, Japan

Reexamination Request:
No. 90/002,576, Feb. 14, 1992

Reexamination Certificate for:
Patent No.: 4,882,507
Issued: Nov. 21, 1989
Appl. No.: 226,307
Filed: Jul. 29, 1988

[30] Foreign Application Priority Data

Jul. 31, 1987 [JP] Japan ............... 62-191602

[51] Int. Cl.$^5$ .............. H03K 3/013; H03K 17/06; H03K 17/16; H03K 17/284
[52] U.S. Cl. ............... 307/443; 307/448; 307/473; 307/270; 307/296.5; 365/194; 365/226
[58] Field of Search .......... 307/443, 448, 451, 517, 307/594, 595, 601, 602, 263; 365/203, 194

[56] References Cited

U.S. PATENT DOCUMENTS

| | | | |
|---|---|---|---|
| 4,345,172 | 8/1982 | Kobayashi et al. | 307/562 |
| 4,355,377 | 10/1982 | Sud et al. | 365/203 |
| 4,614,882 | 9/1986 | Parker et al. | 307/443 |
| 4,731,553 | 3/1988 | Van Lehn et al. | 307/443 |
| 4,818,901 | 4/1989 | Young et al. | 307/451 |

*Primary Examiner*—John S. Heyman
*Attorney, Agent, or Firm*—Finnegan, Henderson, Farabow, Garrett and Dunner

[57] ABSTRACT

A semiconductor integrated circuit includes an output circuit and a control circuit for controlling the output circuit. The control circuit controls the output circuit so as to charge or discharge a preset node in the output circuit at a rate different from an ordinary charging or discharging rate for a preset period of time after a control signal has been changed in level.

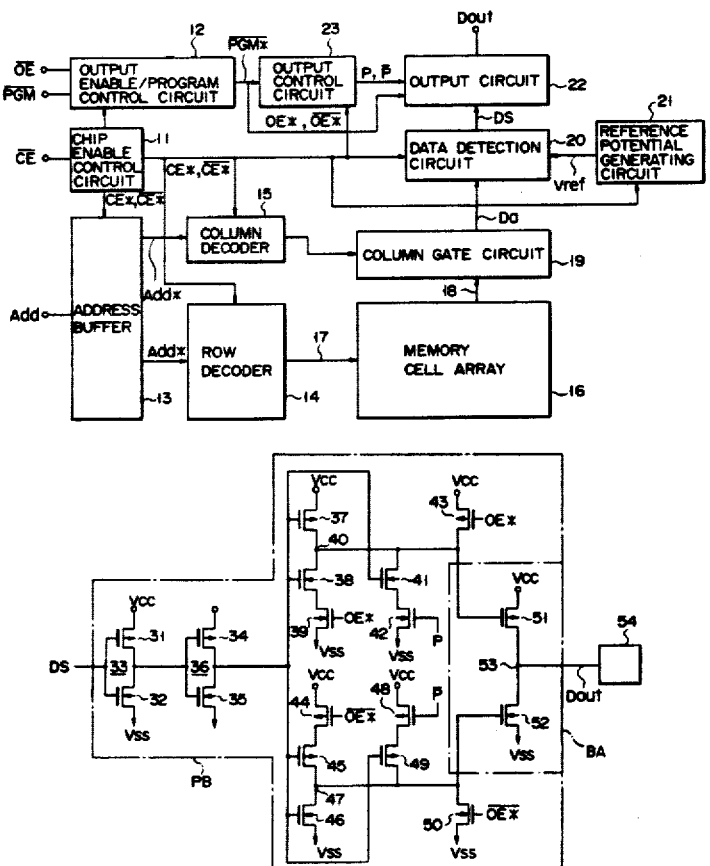

REEXAMINATION CERTIFICATE ISSUED UNDER 35 U.S.C. 307

THE PATENT IS HEREBY AMENDED AS INDICATED:

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 1 lines 28–57:

Since it is necessary to charge or discharge the load capacitor connected to the output terminal[. A], *a* large current will flow at this time, and therefore the power source voltage fluctuates, causing noise to be generated. Such [a] noise may cause the integrated circuit to operate erroneously. Generally, the output circuit includes a buffer amplifier section for directly driving the load, and a pre-amplifier section for driving the buffer amplifier section. In order to suppress generation of noise due to rapid variation in current flowing in the output circuit, transistors constituting the pre-amplifier section or transistors constituting the buffer amplifier section are each formed to have a small channel width in the prior art. In this way, if the channel width of the transistor of the pre-amplifier section is set to be small, the current driving ability of the transistor becomes small, thereby causing the potential of a signal supplied to the gate of the transistor of the buffer amplifier section to rise or fall slowly. Therefore, current flowing in the buffer amplifier section will not vary abruptly, suppressing the noise generation due to the fluctuation in the power source voltage. Also, when the transistor of the buffer amplifier section has a small channel width, a small amount of current flows in the buffer amplifier section. This suppresses the generation of noise due to the fluctuation in the power source voltage, thereby preventing an erroneous circuit operation of the IC. However, with these methods, the operation speed or the data readout speed will be lowered.

Column 4 lines 11–21:

For the reasons described above, even if address access time $t_{ACC}$ is delayed by 10 to 20 ns, it will not give as much influence to the entire operation speed as times $t_{OE}$ and $t_{PGM}$ is delayed by such time. However, if the charging and discharging speeds are lowered in order to suppress the influence due to noise, times $T_{OE}$ and $t_{PGM}$ are prolonged and will not satisfy the standard. With the fact described above taken into consideration, [a] *an* output control circuit for delaying address access time $t_{ACC}$ and reducing times $t_{OE}$ and $t_{PGM}$ is used in this invention.

Column 8 lines 60–68:

FIGS. 5 and 6 show the voltage waveforms at respective points in the memory device according to the above embodiment, FIG. 5 showing the case of the active mode and FIG. 6 showing the case of the output disable mode. Da shown in FIGS. 5 and 6 is output data of column gate circuit 19. As is clearly understood from FIGS. 5 and 6, output data Dout [is] *more* rapidly rises to "1" level in the output disable mode than in the active mode.

Column 9 lines 1–42:

FIG. 7 shows the waveforms of the signals which are generated in the circuit when the potential of node 40 and the potential of output signal Dout are rapidly lowered and raised, respectively. Data detection circuit 20 compares the data Da read from the memory cells, with the reference potential Vref, thus determining whether the data DS is at the "H" or "L" level. As is shown in FIG. 7, when the output circuit operates at high speed, the potential of node 40 starts falling, and the output node 53 is therefore charged, before the potential of the data Da deviates from the reference voltage Vref. As a result of this, a large current flows from the output buffer to the output terminal, and both the power source potential and the ground potential [fluctuate] *fluctuate*. Consequently, noise is generated. The noise inverts the relationship in level between the reference potential Vref and the potential of data Da, which are not [sufficient] *sufficiently* different from each other. The data Da becomes erroneous. More specifically, the potential of this data rises above the reference potential Vref since the noise is superposed on the data Da when ΔVD is small immediately the potential of the data Da falls below potential Vref during the discharging of data Da. The sense amplifier detects this potential rise of data Da. Nonetheless, the difference ΔVD between potential Vref and the potential of data Da remains sufficiently great since both the reference potential Vref and that of data Da are fixed during period $t_{OE}$ or period $t_{PGM}$, as is illustrated in FIG. 6. Hence, even if the reference potential Vref and that of data Da fluctuate because of the noise resulting from a large current flowing in the output circuit, no [invention] *inversion* occurs in their level relationship. This is because internal enable signal OE* charges sufficiently long after the address has changed, as has been described above. Thus, the data Da is read out stably, and does not become erroneous. The output circuit can, therefore, operate at high speed during period $t_{OE}$ and period $t_{PMG}$. During period $t_{ACC}$, the output circuit operates at low speed. Thus, the generation of noise is suppressed during this period even if the potential difference ΔVD is small, and the semiconductor integrated circuit makes no errors during period $t_{ACC}$, too.

Column 10 lines 19–42:

FIG. 9 is a circuit diagram showing the construction of part of output circuit 22 which is provided in the memory device shown in FIG. 1 and which processes one bit of data. This output circuit has two output sections PB1 and PB2, both corresponding to pre-amplifier section PB shown in FIG. 2. The output signal of the PB0, which is equivalent to the input of pre-amplifier section PB, is supplied to output sections PB1 and PB2. The outputs of these sections PB1 and PB2 are input to two buffer amplifier sections BA1 and BA2, respectively, Pre-amplifier sections PB1 and PB2 are formed to have the construction obtained by omitting N-channel MOS transistors 41 and 42 and P-channel MOS transistors 48 and 49 from pre-amplifier section BA shown in FIG. 2. One of pre-amplifier section BA1 is connected to receive signals OE*1 and $\overline{OE*1}$ instead of internal output enable signals OE* and $\overline{OE*}$, and the other pre-amplifier section PB2 is connected to receive signals OE*2 and [OE*2] $\overline{OE^*2}$ instead of internal output enable signals OE* and $\overline{OE^*}$. Output nodes 53 of buffer amplifier sections BA1 and BA2 are connected to terminal 54. Two sets of signals OE*1 and [OE*1] $\overline{OE^*1}$ and signals OE*2 and $\overline{OE^*2}$ are generated at different timings from output control circuit 23.

AS A RESULT OF REEXAMINATION, IT HAS BEEN DETERMINED THAT:

Claims 4, 6 and 7 are cancelled.

Claims 1-3, 5, 8-10 and 13-24 are determined to be patentable as amended.

Claims 11 and 12 dependent on an amended claim, are determined to be patentable.

1. A semiconductor integrated circuit comprising:

[an output circuit including a transistor whose conduction state is controlled according to an internal signal and charging and discharging a preset node by controlling the conduction state of said transistor, thus outputting a signal; and]

*an output circuit for generating an output signal, said output circuit including at least one transistor and a preset node, said at least one transistor having a conduction state controlled by an internal signal and said preset node being charged and discharged depending on the conduction state of said at least one transistor;* and control means *for switching an operation rate of said output circuit based on a predetermined mode of operation, said control means including output control means responsive to a control signal* for [increasing a rate of reduction in the conduction resistance of] *changing a rate of current flowing to* said *at least one* transistor *to change a rate of charging or discharging of said preset node* for a preset period of time after [the] *receipt of said* control signal [has changed in level].

2. A semiconductor integrated circuit according to claim 1, wherein said output circuit *further* includes a signal output terminal; *and*

*wherein said output control means includes* a first output section operated after [the level of] the control signal [is] *has* changed[, and charging] *in level to charge* and [discharging] *discharge* said *signal* output terminal according to the internal signal [and] to output a corresponding *first output* signal; and a section output section operated only [in] *during* a preset period of time after [the level of] the control signal [is] *has* changed[, and changing] *in level to charge* and [discharging] *discharge* said output *signal* terminal according to the internal signal *and* to output a corresponding *second output* signal; and [the] *separate* power source sections for [the buffer transistors] *each* of said first and second output sections [are separated from each other].

3. A semiconductor integrated circuit comprising:

a data output circuit [including a transistor whose conduction state is controlled according to readout data and charging and discharging a preset node at a predetermined rate by controlling the conduction state of said transistor, thus outputting memory cell data] *for generating an output signal, said data output circuit including at least one transistor and a data output terminal, said at least one transistor having a conduction state controlled by memory cell readout data, and said data output terminal being charged and discharged depending on the conduction state of said at least one transistor;* and control means *for switching an operation rate of said data output circuit based on a predetermined mode of operation, said control means including output control means* for charging or discharging the [preset node] *data output terminal* of said data output circuit at a rate different from a predetermined rate for a preset period of time after an output enable signal has changed in level, *said output control means including a first data output section operated after the enable output signal has changed in level to charge and discharge the data output terminal according to the memory cell readout data to output a corresponding first signal, a second data output section operated only during a preset period of time after the enable signal has changed in level to charge and discharge the data output terminal according to the memory cell readout data and to output a corresponding second output signal, and separate power source sections for each of said first and second data output sections.*

5. A semiconductor integrated circuit comprising:

an output circuit including an output circuit including an output node and at least two output transistors each having a drain, a source, and a gate, *each of said at least two output transistors having a conduction state controlled by an internal signal,* wherein one of said *at least two output* transistors charges the output node *when said one of said at least two output transistors is in an ON state*, and the other of said *at least two output* transistors discharges the output node *when the other of said at least two output transistors is in an ON state*; and control means for changing the speed at which [the] *a* potential [of] *varies at* the gate of at least one of said *at least two* output transistors [varies], *thereby switching an operation rate of said output circuit based on a predetermined mode of operation, said control means including a plurality of switching transistors, and wherein an effective channel width is changed based on the number of said switching transistors which are simultaneously used to charge or discharge the gates of said at least two output transistors.*

8. A semiconductor integrated circuit according to claim [6 or 7] *5*, wherein said control means includes pulse signal generating means for generating a pulse signal when a control signal change [to a higher level or a lower level] *logic levels*, and *wherein* the pulse signal is used to change said effective channel width.

9. A semiconductor integrated circuit according to claim 8, wherein said control means turns off [said] *one of said at least two* output [transistor] *transistors* when said control signal *is* at a first logic level, and turns on said *one of said at least two* output [transistor] *transistors* when said control signal rises or falls from said first logic level.

10. A semiconductor integrated circuit according to claim 5, wherein said output circuit includes a first transistor of a first channel type having a current path connected between said output node and a first potential-applying means, and a second transistor of a second channel type having a current path connected between said output node and a second potential-applying means; and said control means includes first charging-/discharging control means for charging or discharging a first node connected to [the] *a* gate of said first transistor[,] after [the level of] said control signal has changed *logic levels*, in accordance with detection data and [inverting] *an inverted* internal enable signal[,]; second charging/discharging control means for charging or discharging a second node connected to [the] *a* gate of said second transistor[,] after [the level of] said control signal has changed *logic levels*, in accordance with the detection data and the internal enable signal, [dicharging] *first node discharging* control means for discharging said first node in accordance with the [detecting] *detection* data and a pulse signal during a predetermined period after [the level of] said control signal has changed *logic levels*, and *second node* charging control means for charging said second node in accordance with the [detecting] *detection* data and [a] *an inverted pulse* signal [obtained by inverting the pulse signal,] during said predetermined period.

13. A semiconductor integrated circuit according to claim 5, further comprising a first potential-applying means for applying a first potential, and a second potential-applying means for applying a [first] *second* potential, and wherein said control means includes a third potential-applying means for applying a third potential [which is somewhere] *having a value* between the first and second potentials.

14. A semiconductor integrated circuit according to claim 13, wherein said control means includes a plurality of switching transistors for charging or discharging the [gate] *gates* of said *at least two* output [transistor, only some of the] *transistors, a predetermined number of said* switching transistors [are used to charge] *charging* or [discharge] *discharging* the [gate] *gates* of said *at least two* output [transistor] *transistors to* thereby [to] reduce said speed, [while] the remaining switching transistors [charge] *charging* or [discharge] *discharging* the gate of said output transistor at said third potential.

15. A semiconductor integrated circuit according to claim 13 or 14, wherein said third potential-applying means comprises a transistor having a source connected to *one of* said first [or second] potential-applying means *or said second potential-applying means*, a drain, and a gate connected to the drain.

16. A semiconductor integrated circuit according to claim 5, wherein said output circuit includes a first transistor of a first channel type having a current path connected between said output node, [and] a first potential-applying means [and] *for applying a first potential*, a second transistor of a second channel type having a current path connected between said output node, and a second potential-applying means *for applying a second potential*; said control means includes first charging/discharging control means for charging or discharging a first node connected to [the] *a* gate of said first transistor[,] after [the level of] said control signal has changed *logic levels*, in accordance with detection data and [inverting] *an inverted* internal enable signal[,]; second charging/discharging control means for charging or discharging a second node connected to [the] *a* gate of said second transistor[,] after [the level of] said control signal has changed *logic levels*, in accordance with the detection data and the internal enable signal, a third potential-applying means for applying a *third* potential to said first charging/discharging means, said *third* potential being higher than the *second* potential applied [from] *by* said second potential-applying means by a predetermined value, a fourth potential-applying means for applying a *fourth* potential to said second charging/discharging means, said *fourth* potential being lower than the *first* potential applied from said first potential-applying means by a predetermined value, *first node* discharging control means for discharging said first node in accordance with the [detecting] *detection* data and a pulse signal during a predetermined period after [the level of] said control signal has changed *logic levels*, and *said node* charging control means for charging said second node in accordance with the [detecting] *detection* data and [a] *an inverted pulse* signal [obtained by inverting the pulse signal], during said predetermined period.

17. A semiconductor integrated circuit according to claim 5, wherein said output circuit includes a first transistor of a first channel type having a current path connected between said output node, [and] a first potential-applying means [and] *for applying a first potential*, a second transistor of a second channel type having a current path connected between said output node, and a second potential-applying means *for applying second potential;* and said control means includes first charging/discharging control means for charging or discharging a first node connected to [the] *a* gate of said first [transistor,] *transistor* after [the level of] said control signal has changed *logic levels*, in accordance with detection data and [inverting] *an inverted* internal enable signal[,]; second charging/discharging control means for charging or discharging a second node connected to [the] *a* gate of said second transistor[,] after [the level of] said control signal has changed *logic levels*, in accordance with the detection data and [the] *an* internal enable signal, a third potential-applying means for applying a *third* potential to said first charging/discharging means, said *third* potential being higher than the potential applied [from] *by* said second potential-applying means by a value determined by the threshold voltage of a transistor, a fourth potential-applying means for applying a *fourth* potential to said second charging/discharging means, said *fourth* potential being lower than the *first* potential applied from said first potential-applying means by the value determined by the threshold voltage of a transistor, *first node* discharging control means for discharging said first node in accordane with the [detecting] *detection* data and the pulse signal during a predetermined period after [the level of] said control signal has changed *logic levels*, and *second node* charging control means for charging said second node in accordance with the [detecting] *detection* data and [a] *an inverted pulse* signal [obtained by inverting the pulse signal], during said predetermined period.

18. A semiconductor integrated circuit according to claim 5, wherein said output circuit includes a first transistor of a first channel type having a current path connected between said output node, [and] a first potential-applying means *for applying a first potential*, a second transistor of a second channel type having a current path connected between said output node, [and] a second potential-applying means *for applying a second potential*, a third transistor of the first channel type having a current path connected between said output node and the first potential-applying means, and a fourth transistor of the second channel type having a current path connected between said output node and said second potential-applying means; and said control means includes first charging/discharging control means for charging or discharging a first node connected to [the] *a* gate of said first transistor[,] after [the level of] said control signal has changed *logic levels*, in accordance with detection data and [a signal obtained by inverting a] *an inverted* first internal enable signal[,]; second charging/discharging control means for charging or discharging a second node connected to [the] *a* gate of said second transistor[,] after [the level of] said control signal has changed *logic levels*, in accordance with the detection data and [the] *a* first internal enable signal[,]; third charging/discharging control means for charging or discharging a third node connected to [the] *a* gate of said third transistor[,] after [the level of] said control signal has changed *logic levels*, in accordance with the detection data and [a signal obtained by inverting a] *an inverted* second internal enable signal[,]; fourth charging/discharging control means for charging or discharging a fourth node connected to [the] *a* gate of said fourth transistor[,] after [the level of] said control signal has changed *logic levels*, in accordance with the detection data and [the] *a* second internal enable signal[,]; *third node* discharging control means for discharging said third node in accordance with the [detecting] *detection* data and the pulse signal during a predetermined period after [the level of] said control signal has changed[,]; *logic levels* and *fourth node* charging control means for charging said fourth node in accordance with the detecting data and [a signal obtained by inverting the] *an inverted* pulse signal[,] during said predetermined period.

19. A semiconductor integrated circuit according to claim 5, wherein said output circuit includes a first transistor of a first channel type having a current path connected between said output node, [and] a first potential-applying means *for applying a first potential*, a second transistor of a second channel type having a current path connected between said output node, [and] a second potential-applying means *for applying a second potential*, a third transistor of the first channel type having a current path connected between said output node and the first potential-applying means, and a fourth transistor of the second channel type having a current path connected between said output node and said second potential-applying means; and said control means includes first charging/discharging control means for charging or discharging a first node connected to [the] *a* gate of said first transistor[,] after [the level of] said control signal has changed *logic levels*, in accordance with detection data and [a signal obtained by inverting a] *an inverted* first internal enable signal[,]; second charging/discharging control means for charging or discharging a second node connected to the gate of said second transistor[,] after [the level of] said control signal has changed *logic levels*, in accor-dance with the detection data and [the] *a* first internal enable signal[,]; third charging/discharging control means for charging or discharging a third node connected to the gate of said third transistor[,] after [the level of] said control signal has changed *logic levels*, in accordance with the detection data and [a signal obtained by inverting a] *an inverted* second internal enable signal[,]; fourth charging/discharging control means for charging or discharging a fourth node connected to the gate of said fourth transistor[,] after [the level of] said control signal has changed *logic levels*, in accordance with the detection data and [the] *a* second internal enable signal.

20. A semiconductor integrated circuit comprising:
an output circuit including an output node, a first output section for charging the output node in response to an internal signal, and a second output section for discharging the output node, at least one of said output sections having at least two transistors each having a source-drain current path connected at one end to said output node;
control means for turning off said transistors when a control signal is at a first logic level, *for* turning on said transistors in response to the internal signal after [the level of] said control signal has changed from [the] *a* first logic level to a second logic level, and *for* turning off at least one of said transistors upon lapse of a predetermined period after [the level of] said control signal has changed from the first logic level to a second logic level, [thereby to diffenentiate the] *wherein said control means changes* response speeds of said transistors and/or the speeds at which [the] gate voltages of said transistors change.

21. A semiconductor integrated circuit according to claim 5, 14 or 20, further comprising an array of memory cells, a row decoder and a column decoder which cooperate to select [the] memory cells, and *a* data detecting circuit *for* detecting data stored in any memory cell selected by the row and column decoders.

22. A semiconductor integrated circuit according to claim 21, wherein said control signal is generated from an *external* output enable signal [externally] input to the semiconductor integrated circuit.

23. A semiconductor integrated circuit according to claim 8, further comprising an array of memory cells, a row decoder and a column decoder which cooperate to select [the] memory cells, and *a* data detecting circuit *for* detecting data stored in any memory cell selected by the row and column decoders.

24. A semiconductor integrated circuit according to claim 23, wherein said control signal is generated from an *external* output enable signal [externally] input to the semiconductor integrated circuit.

* * * * *